(12) United States Patent
Luo et al.

(10) Patent No.: US 7,527,996 B2
(45) Date of Patent: May 5, 2009

(54) NON-PLANAR SURFACE STRUCTURES AND PROCESS FOR MICROELECTROMECHANICAL SYSTEMS

(75) Inventors: Qi Luo, Cupertino, CA (US); Sriram Akella, Fremont, CA (US); Lior Kogut, Sunnyvale, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 51 days.

(21) Appl. No.: 11/406,981

(22) Filed: Apr. 19, 2006

(65) Prior Publication Data
US 2007/0249081 A1    Oct. 25, 2007

(51) Int. Cl.
*H01L 21/00* (2006.01)
(52) U.S. Cl. .................. 438/48; 438/50; 257/E29.001
(58) Field of Classification Search .................. 438/48, 438/50; 257/E29.001, E29.028, E29.052
See application file for complete search history.

(56) References Cited

U.S. PATENT DOCUMENTS

| 2,534,846 | A | 12/1950 | Ambrose et al. |
|---|---|---|---|
| 3,439,973 | A | 4/1969 | Paul et al. |
| 3,443,854 | A | 5/1969 | Weiss |
| 3,616,312 | A | 10/1971 | McGriff et al. |
| 3,653,741 | A | 4/1972 | Marks |
| 3,656,836 | A | 4/1972 | de Cremoux et al. |
| 3,725,868 | A | 4/1973 | Malmer, Jr. et al. |
| 3,813,265 | A | 5/1974 | Marks |
| 3,955,880 | A | 5/1976 | Lierke |
| 4,099,854 | A | 7/1978 | Decker et al. |
| 4,196,396 | A | 4/1980 | Smith |
| 4,228,437 | A | 10/1980 | Shelton |
| 4,377,324 | A | 3/1983 | Durand et al. |
| 4,389,096 | A | 6/1983 | Hori et al. |

(Continued)

FOREIGN PATENT DOCUMENTS

CH    681 047    12/1992

(Continued)

OTHER PUBLICATIONS

Office Action for U.S. Appl. No. 11/189,690, filed Aug. 2, 2007.

(Continued)

*Primary Examiner*—Walter L Lindsay, Jr.
*Assistant Examiner*—Abdulfattah Mustapha
(74) *Attorney, Agent, or Firm*—Knobbe Martens Olson and Bear LLP

(57) ABSTRACT

Methods of making MEMS devices including interferometric modulators involve depositing various layers, including stationary layers, movable layers and sacrificial layers, on a substrate. Voids are formed in one or more of the various layers so as to form a non-planar surface on the movable and/or the stationary layers. The voids are formed to extend through less than the entire thickness of the layer where they are being formed. Other layers may be formed over the formed voids. Removal of the sacrificial layer from between the resulting non-planar movable and/or stationary layers results in a released MEMS device having reduced contact area between the movable and stationary layers when the MEMS device is actuated. The reduced contact area results in lower adhesion forces and reduced stiction during actuation of the MEMS device. These methods may be used to manufacture released and unreleased interferometric modulators.

20 Claims, 15 Drawing Sheets

U.S. PATENT DOCUMENTS

| | | |
|---|---|---|
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,218,472 A | 6/1993 | Jozefowicz et al. |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |

| | | | | | | | |
|---|---|---|---|---|---|---|---|
| 5,619,366 | A | 4/1997 | Rhoads et al. | 6,215,221 | B1 | 4/2001 | Cabuz et al. |
| 5,622,814 | A | 4/1997 | Miyata et al. | 6,219,015 | B1 | 4/2001 | Bloom et al. |
| 5,629,790 | A | 5/1997 | Neukermans et al. | 6,229,683 | B1 | 5/2001 | Goodwin-Johansson |
| 5,633,652 | A | 5/1997 | Kanbe et al. | 6,232,936 | B1 | 5/2001 | Gove et al. |
| 5,636,052 | A | 6/1997 | Arney et al. | 6,243,149 | B1 | 6/2001 | Swanson et al. |
| 5,636,185 | A | 6/1997 | Brewer et al. | 6,246,398 | B1 | 6/2001 | Koo |
| 5,638,084 | A | 6/1997 | Kalt | 6,249,039 | B1 | 6/2001 | Harvey et al. |
| 5,638,946 | A | 6/1997 | Zavracky | 6,282,010 | B1 | 8/2001 | Sulzbach et al. |
| 5,641,391 | A | 6/1997 | Hunter et al. | 6,284,560 | B1 | 9/2001 | Jech et al. |
| 5,646,768 | A | 7/1997 | Kaeriyama | 6,288,472 | B1 | 9/2001 | Cabuz et al. |
| 5,647,819 | A | 7/1997 | Fujita et al. | 6,295,154 | B1 | 9/2001 | Laor et al. |
| 5,650,834 | A | 7/1997 | Nakagawa et al. | 6,297,072 | B1 | 10/2001 | Tilmans et al. |
| 5,650,881 | A | 7/1997 | Hornbeck | 6,323,982 | B1 | 11/2001 | Hornbeck |
| 5,654,741 | A | 8/1997 | Sampsell et al. | 6,327,071 | B1 | 12/2001 | Kimura et al. |
| 5,657,099 | A | 8/1997 | Doherty et al. | 6,329,297 | B1 | 12/2001 | Balish et al. |
| 5,659,374 | A | 8/1997 | Gale, Jr. et al. | 6,335,831 | B2 | 1/2002 | Kowarz et al. |
| 5,665,997 | A | 9/1997 | Weaver et al. | 6,351,329 | B1 | 2/2002 | Greywall |
| 5,673,139 | A | 9/1997 | Johnson | 6,356,254 | B1 | 3/2002 | Kimura |
| 5,674,757 | A | 10/1997 | Kim | 6,359,673 | B1 | 3/2002 | Stephenson |
| 5,683,591 | A | 11/1997 | Offenberg | 6,376,787 | B1 | 4/2002 | Martin et al. |
| 5,703,710 | A | 12/1997 | Brinkman et al. | 6,377,233 | B2 | 4/2002 | Colgan et al. |
| 5,706,022 | A | 1/1998 | Hato | 6,391,675 | B1 | 5/2002 | Ehmke et al. |
| 5,710,656 | A | 1/1998 | Goossen | 6,392,233 | B1 | 5/2002 | Channin et al. |
| 5,726,480 | A | 3/1998 | Pister | 6,392,781 | B1 | 5/2002 | Kim et al. |
| 5,739,945 | A | 4/1998 | Tayebati | 6,407,851 | B1 | 6/2002 | Islam et al. |
| 5,745,193 | A | 4/1998 | Urbanus et al. | 6,447,126 | B1 | 9/2002 | Hornbeck |
| 5,745,281 | A | 4/1998 | Yi et al. | 6,448,622 | B1 | 9/2002 | Franke et al. |
| 5,771,116 | A | 6/1998 | Miller et al. | 6,452,465 | B1 | 9/2002 | Brown et al. |
| 5,784,190 | A | 7/1998 | Worley | 6,456,420 | B1 | 9/2002 | Goodwin-Johansson |
| 5,784,212 | A | 7/1998 | Hornbeck | 6,465,355 | B1 | 10/2002 | Horsley |
| 5,793,504 | A | 8/1998 | Stoll | 6,466,354 | B1 | 10/2002 | Gudeman |
| 5,808,780 | A | 9/1998 | McDonald | 6,466,358 | B2 | 10/2002 | Tew |
| 5,818,095 | A | 10/1998 | Sampsell | 6,473,274 | B1 | 10/2002 | Maimone et al. |
| 5,822,110 | A | 10/1998 | Dabbaj | 6,480,177 | B2 | 11/2002 | Doherty et al. |
| 5,822,170 | A | 10/1998 | Cabuz et al. | 6,496,122 | B2 | 12/2002 | Sampsell |
| 5,824,608 | A | 10/1998 | Gotoch et al. | 6,513,911 | B1 | 2/2003 | Ozaki et al. |
| 5,825,528 | A | 10/1998 | Goosen | 6,522,801 | B1 | 2/2003 | Aksyuk et al. |
| 5,835,255 | A | 11/1998 | Miles | 6,531,945 | B1 | 3/2003 | Ahn et al. |
| 5,838,484 | A | 11/1998 | Goosen et al. | 6,537,427 | B1 | 3/2003 | Raina et al. |
| 5,842,088 | A | 11/1998 | Thompson | 6,545,335 | B1 | 4/2003 | Chua et al. |
| 5,867,302 | A | 2/1999 | Fleming et al. | 6,548,908 | B2 | 4/2003 | Chua et al. |
| 5,896,796 | A | 4/1999 | Chih | 6,549,338 | B1 | 4/2003 | Wolverton et al. |
| 5,912,758 | A | 6/1999 | Knipe et al. | 6,552,840 | B2 | 4/2003 | Knipe |
| 5,943,158 | A | 8/1999 | Ford et al. | 6,574,033 | B1 | 6/2003 | Chui et al. |
| 5,959,763 | A | 9/1999 | Bozler et al. | 6,577,785 | B1 | 6/2003 | Spahn et al. |
| 5,967,163 | A | 10/1999 | Pan et al. | 6,589,625 | B1 | 7/2003 | Kothari et al. |
| 5,972,193 | A | 10/1999 | Chou et al. | 6,600,201 | B2 | 7/2003 | Hartwell et al. |
| 5,976,902 | A | 11/1999 | Shih | 6,602,791 | B2 | 8/2003 | Ouellet et al. |
| 5,986,796 | A | 11/1999 | Miles | 6,606,175 | B1 | 8/2003 | Sampsell et al. |
| 6,016,693 | A | 1/2000 | Viani et al. | 6,608,268 | B1 | 8/2003 | Goldsmith |
| 6,028,690 | A | 2/2000 | Carter et al. | 6,610,440 | B1 | 8/2003 | LaFollette et al. |
| 6,031,653 | A | 2/2000 | Wang | 6,625,047 | B2 | 9/2003 | Coleman, Jr. |
| 6,038,056 | A | 3/2000 | Florence et al. | 6,630,786 | B2 | 10/2003 | Cummings et al. |
| 6,040,937 | A | 3/2000 | Miles | 6,632,698 | B2 | 10/2003 | Ives |
| 6,049,317 | A | 4/2000 | Thompson et al. | 6,635,919 | B1 | 10/2003 | Melendez et al. |
| 6,055,090 | A | 4/2000 | Miles | 6,642,913 | B1 | 11/2003 | Kimura et al. |
| 6,057,903 | A | 5/2000 | Colgan et al. | 6,643,069 | B2 | 11/2003 | Dewald |
| 6,061,075 | A | 5/2000 | Nelson et al. | 6,650,455 | B2 | 11/2003 | Miles |
| 6,099,132 | A | 8/2000 | Kaeriyama | 6,657,832 | B2 | 12/2003 | Williams et al. |
| 6,100,477 | A | 8/2000 | Randall et al. | 6,666,561 | B1 | 12/2003 | Blakley |
| 6,100,872 | A | 8/2000 | Aratani et al. | 6,674,033 | B1 | 1/2004 | Chui et al. |
| 6,113,239 | A | 9/2000 | Sampsell et al. | 6,674,090 | B1 | 1/2004 | Chua et al. |
| 6,115,326 | A | 9/2000 | Puma et al. | 6,674,562 | B1 | 1/2004 | Miles et al. |
| 6,147,790 | A | 11/2000 | Meier et al. | 6,680,792 | B2 | 1/2004 | Miles |
| 6,158,156 | A | 12/2000 | Patrick | 6,710,908 | B2 | 3/2004 | Miles et al. |
| 6,160,833 | A | 12/2000 | Floyd et al. | 6,713,235 | B1 | 3/2004 | Ide et al. |
| 6,165,890 | A | 12/2000 | Kohl et al. | 6,720,267 | B1 | 4/2004 | Chen et al. |
| 6,166,422 | A | 12/2000 | Qian et al. | 6,736,987 | B1 | 5/2004 | Cho |
| 6,180,428 | B1 | 1/2001 | Peeters et al. | 6,741,377 | B2 | 5/2004 | Miles |
| 6,194,323 | B1 | 2/2001 | Downey et al. | 6,741,384 | B1 | 5/2004 | Martin et al. |
| 6,195,196 | B1 | 2/2001 | Kimura et al. | 6,741,503 | B1 | 5/2004 | Farris et al. |
| 6,201,633 | B1 | 3/2001 | Peeters et al. | 6,743,570 | B2 | 6/2004 | Harnett et al. |
| 6,204,080 | B1 | 3/2001 | Hwang | 6,747,785 | B2 | 6/2004 | Chen et al. |

| | | | | | | |
|---|---|---|---|---|---|---|
| 6,747,800 B1 | 6/2004 | Lin | | 2003/0006468 A1 | 1/2003 | Ma et al. |
| 6,756,317 B2 | 6/2004 | Sniegowski et al. | | 2003/0021004 A1 | 1/2003 | Cunningham |
| 6,768,097 B1 | 7/2004 | Viktorovitch et al. | | 2003/0043157 A1 | 3/2003 | Miles |
| 6,775,174 B2 | 8/2004 | Huffman et al. | | 2003/0054588 A1 | 3/2003 | Patel et al. |
| 6,778,155 B2 | 8/2004 | Doherty et al. | | 2003/0062186 A1 | 4/2003 | Boroson et al. |
| 6,778,306 B2 | 8/2004 | Sniegowski et al. | | 2003/0072070 A1 | 4/2003 | Miles |
| 6,782,166 B1 | 8/2004 | Grote et al. | | 2003/0090350 A1 | 5/2003 | Feng et al. |
| 6,794,119 B2 | 9/2004 | Miles | | 2003/0112096 A1 | 6/2003 | Potter |
| 6,803,534 B1 | 10/2004 | Chen et al. | | 2003/0138213 A1 | 7/2003 | Jin et al. |
| 6,806,110 B2 | 10/2004 | Lester et al. | | 2003/0152872 A1 | 8/2003 | Miles |
| 6,811,267 B1 | 11/2004 | Allen et al. | | 2003/0201784 A1 | 10/2003 | Potter |
| 6,812,482 B2 | 11/2004 | Fleming et al. | | 2003/0202264 A1 | 10/2003 | Weber et al. |
| 6,819,469 B1 | 11/2004 | Koba | | 2003/0202265 A1 | 10/2003 | Reboa et al. |
| 6,822,628 B2 | 11/2004 | Dunphy et al. | | 2003/0202266 A1 | 10/2003 | Ring et al. |
| 6,829,132 B2 | 12/2004 | Martin et al. | | 2003/0205479 A1 | 11/2003 | Lin et al. |
| 6,853,129 B1 | 2/2005 | Cummings et al. | | 2003/0231373 A1 | 12/2003 | Kowarz et al. |
| 6,855,610 B2 | 2/2005 | Tung et al. | | 2004/0010115 A1 | 1/2004 | Sotzing |
| 6,859,218 B1 | 2/2005 | Luman et al. | | 2004/0021085 A1 | 2/2004 | Prince et al. |
| 6,861,277 B1 | 3/2005 | Monroe et al. | | 2004/0027636 A1 | 2/2004 | Miles |
| 6,862,022 B2 | 3/2005 | Slupe | | 2004/0027701 A1 | 2/2004 | Ishikawa |
| 6,862,029 B1 | 3/2005 | D'Souza et al. | | 2004/0028849 A1 | 2/2004 | Stark et al. |
| 6,867,896 B2 | 3/2005 | Miles | | 2004/0035821 A1 | 2/2004 | Doan et al. |
| 6,870,581 B2 | 3/2005 | Li et al. | | 2004/0038513 A1 | 2/2004 | Kohl et al. |
| 6,870,654 B2 | 3/2005 | Lin et al. | | 2004/0051929 A1 | 3/2004 | Sampsell et al. |
| 6,882,458 B2 | 4/2005 | Lin et al. | | 2004/0053434 A1 | 3/2004 | Bruner |
| 6,882,461 B1 | 4/2005 | Tsai et al. | | 2004/0058531 A1 | 3/2004 | Hsieh et al. |
| 6,912,022 B2 | 6/2005 | Lin et al. | | 2004/0058532 A1 | 3/2004 | Miles et al. |
| 6,952,303 B2 | 10/2005 | Lin et al. | | 2004/0061543 A1 | 4/2004 | Nam et al. |
| 6,952,304 B2 | 10/2005 | Mushika et al. | | 2004/0063322 A1 | 4/2004 | Yang |
| 6,953,702 B2 | 10/2005 | Miller et al. | | 2004/0080807 A1 | 4/2004 | Chen et al. |
| 6,958,847 B2 | 10/2005 | Lin | | 2004/0080832 A1 | 4/2004 | Singh |
| 6,972,891 B2 | 12/2005 | Patel et al. | | 2004/0087086 A1 | 5/2004 | Lee |
| 6,982,820 B2 | 1/2006 | Tsai | | 2004/0100677 A1 | 5/2004 | Huibers et al. |
| 6,995,890 B2 | 2/2006 | Lin | | 2004/0124073 A1 | 7/2004 | Pilans et al. |
| 6,999,225 B2 | 2/2006 | Lin | | 2004/0124483 A1 | 7/2004 | Partridge et al. |
| 6,999,236 B2 | 2/2006 | Lin | | 2004/0124495 A1 | 7/2004 | Chen et al. |
| 7,008,812 B1 | 3/2006 | Carley | | 2004/0125281 A1 | 7/2004 | Lin et al. |
| 7,012,726 B1 | 3/2006 | Miles | | 2004/0125282 A1 | 7/2004 | Lin et al. |
| 7,027,202 B1 | 4/2006 | Hunter et al. | | 2004/0125536 A1 | 7/2004 | Arney et al. |
| 7,041,224 B2 | 5/2006 | Patel et al. | | 2004/0136076 A1 | 7/2004 | Tayebati |
| 7,041,571 B2 | 5/2006 | Strane | | 2004/0145049 A1 | 7/2004 | McKinnell et al. |
| 7,049,164 B2 | 5/2006 | Bruner | | 2004/0145811 A1 | 7/2004 | Lin et al. |
| 7,078,293 B2 | 7/2006 | Lin et al. | | 2004/0147056 A1 | 7/2004 | McKinnell et al. |
| 7,110,158 B2 | 9/2006 | Miles | | 2004/0147198 A1 | 7/2004 | Lin et al. |
| 7,119,945 B2 | 10/2006 | Kothari et al. | | 2004/0148009 A1 | 7/2004 | Buzzard |
| 7,123,216 B1 | 10/2006 | Miles | | 2004/0150869 A1 | 8/2004 | Kasai |
| 7,172,915 B2 | 2/2007 | Lin et al. | | 2004/0160143 A1 | 8/2004 | Shreeve et al. |
| 7,198,973 B2 | 4/2007 | Lin et al. | | 2004/0174583 A1 | 9/2004 | Chen et al. |
| 7,221,495 B2 | 5/2007 | Miles et al. | | 2004/0175577 A1 | 9/2004 | Lin et al. |
| 7,256,107 B2 | 8/2007 | Takeuchi et al. | | 2004/0179281 A1 | 9/2004 | Reboa |
| 2001/0003487 A1 | 6/2001 | Miles | | 2004/0179445 A1 | 9/2004 | Park |
| 2001/0026951 A1 | 10/2001 | Vergani et al. | | 2004/0191937 A1 | 9/2004 | Patel et al. |
| 2001/0040649 A1 | 11/2001 | Ozaki | | 2004/0191946 A1 | 9/2004 | Patel et al. |
| 2001/0040675 A1 | 11/2001 | True et al. | | 2004/0197526 A1 | 10/2004 | Mehta |
| 2002/0014579 A1 | 2/2002 | Dunfield | | 2004/0207897 A1 | 10/2004 | Lin |
| 2002/0015215 A1 | 2/2002 | Miles | | 2004/0207898 A1 | 10/2004 | Lin et al. |
| 2002/0021485 A1 | 2/2002 | Pilossof | | 2004/0209192 A1 | 10/2004 | Lin et al. |
| 2002/0024711 A1 | 2/2002 | Miles | | 2004/0209195 A1 | 10/2004 | Lin |
| 2002/0027636 A1 | 3/2002 | Yamada | | 2004/0212026 A1 | 10/2004 | Van Brocklin et al. |
| 2002/0036304 A1 | 3/2002 | Ehmke et al. | | 2004/0217264 A1 | 11/2004 | Wood et al. |
| 2002/0054424 A1 | 5/2002 | Miles | | 2004/0217378 A1 | 11/2004 | Martin et al. |
| 2002/0055253 A1 | 5/2002 | Rudhard | | 2004/0217919 A1 | 11/2004 | Piehl et al. |
| 2002/0071169 A1 | 6/2002 | Bowers et al. | | 2004/0218251 A1 | 11/2004 | Piehl et al. |
| 2002/0075555 A1 | 6/2002 | Miles | | 2004/0218334 A1 | 11/2004 | Martin et al. |
| 2002/0086455 A1 | 7/2002 | Franosch et al. | | 2004/0218341 A1 | 11/2004 | Martin et al. |
| 2002/0110948 A1 | 8/2002 | Huang et al. | | 2004/0227493 A1 | 11/2004 | Van Brocklin et al. |
| 2002/0117728 A1 | 8/2002 | Brosnihan et al. | | 2004/0240027 A1 | 12/2004 | Lin et al. |
| 2002/0126364 A1 | 9/2002 | Miles | | 2004/0240032 A1 | 12/2004 | Miles |
| 2002/0135857 A1 | 9/2002 | Fitzpatrick et al. | | 2004/0240138 A1 | 12/2004 | Martin et al. |
| 2002/0137072 A1 | 9/2002 | Mirkin et al. | | 2004/0245588 A1 | 12/2004 | Nikkel et al. |
| 2002/0149828 A1 | 10/2002 | Miles | | 2004/0263944 A1 | 12/2004 | Miles et al. |
| 2002/0167730 A1 | 11/2002 | Needham et al. | | 2005/0001828 A1 | 1/2005 | Martin et al. |
| 2002/0168136 A1 | 11/2002 | Atia et al. | | 2005/0003667 A1 | 1/2005 | Lin et al. |

| | | | |
|---|---|---|---|
| 2005/0012577 A1 | 1/2005 | Pillans et al. | |
| 2005/0012975 A1 | 1/2005 | George et al. | |
| 2005/0014374 A1 | 1/2005 | Partridge et al. | |
| 2005/0020089 A1 | 1/2005 | Shi et al. | |
| 2005/0024557 A1 | 2/2005 | Lin | |
| 2005/0035699 A1 | 2/2005 | Tsai | |
| 2005/0036095 A1 | 2/2005 | Yeh et al. | |
| 2005/0036192 A1 | 2/2005 | Lin et al. | |
| 2005/0038950 A1 | 2/2005 | Adelmann | |
| 2005/0042117 A1 | 2/2005 | Lin | |
| 2005/0046922 A1 | 3/2005 | Lin et al. | |
| 2005/0046948 A1 | 3/2005 | Lin | |
| 2005/0057442 A1 | 3/2005 | Way | |
| 2005/0068583 A1 | 3/2005 | Gutkowski et al. | |
| 2005/0068605 A1 | 3/2005 | Tsai | |
| 2005/0068606 A1 | 3/2005 | Tsai | |
| 2005/0069209 A1 | 3/2005 | Damera-Venkata et al. | |
| 2005/0078348 A1 | 4/2005 | Lin | |
| 2005/0098840 A1 | 5/2005 | Fuertsch et al. | |
| 2005/0118832 A1 | 6/2005 | Korzenski et al. | |
| 2005/0168849 A1 | 8/2005 | Lin | |
| 2005/0170670 A1 | 8/2005 | King et al. | |
| 2005/0195462 A1 | 9/2005 | Lin | |
| 2005/0195467 A1 | 9/2005 | Kothari et al. | |
| 2005/0202649 A1 | 9/2005 | Hung et al. | |
| 2005/0250235 A1 | 11/2005 | Miles et al. | |
| 2006/0024880 A1 | 2/2006 | Chui et al. | |
| 2006/0066932 A1 | 3/2006 | Chui | |
| 2006/0066935 A1 | 3/2006 | Cummings et al. | |
| 2006/0067646 A1* | 3/2006 | Chui | 385/147 |
| 2006/0076311 A1 | 4/2006 | Tung et al. | |
| 2006/0077155 A1 | 4/2006 | Chui et al. | |
| 2006/0077502 A1 | 4/2006 | Tung et al. | |
| 2006/0077529 A1 | 4/2006 | Chui et al. | |
| 2006/0119922 A1 | 6/2006 | Faase et al. | |
| 2006/0177950 A1 | 8/2006 | Lin et al. | |
| 2006/0209386 A1 | 9/2006 | Sudak et al. | |
| 2006/0256420 A1 | 11/2006 | Miles et al. | |
| 2006/0257070 A1 | 11/2006 | Lin et al. | |
| 2007/0155051 A1* | 7/2007 | Wang et al. | 438/107 |
| 2007/0196944 A1 | 8/2007 | Chou et al. | |
| 2007/0206267 A1 | 9/2007 | Tung et al. | |
| 2007/0249078 A1* | 10/2007 | Tung et al. | 438/48 |
| 2007/0269748 A1 | 11/2007 | Miles | |
| 2008/0026328 A1 | 1/2008 | Miles | |
| 2008/0068699 A1 | 3/2008 | Miles | |
| 2008/0130089 A1 | 6/2008 | Miles | |
| 2008/0226929 A1 | 9/2008 | Chung et al. | |

FOREIGN PATENT DOCUMENTS

| | | |
|---|---|---|
| CN | 092109265 | 11/2003 |
| DE | 199 38 072 | 3/2000 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0 788 005 | 8/1997 |
| EP | 0878824 A2 | 11/1998 |
| EP | 1197778 | 4/2002 |
| EP | 1 209 738 | 5/2002 |
| EP | 1258860 A1 | 11/2002 |
| EP | 1 452 481 A | 9/2004 |
| EP | 1640772 | 3/2006 |
| JP | 49-004993 | 1/1974 |
| JP | 405275401 A | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2001-085519 | 3/2001 |
| JP | 2002-0287047 | 3/2001 |
| JP | 2002 062493 | 2/2002 |
| JP | 2002-207182 | 7/2002 |
| JP | 2002-243937 | 8/2002 |
| JP | 2002-270575 | 9/2002 |
| JP | 2002-328313 | 11/2002 |
| JP | 2002-355800 | 12/2002 |
| JP | 2003001598 A | 1/2003 |
| JP | 2004-102022 A | 4/2004 |
| JP | 2004-133281 | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| WO | WO 91/05284 | 4/1991 |
| WO | 157313 | 5/1991 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 01/63657 | 8/2001 |
| WO | WO 02/24570 | 3/2002 |
| WO | WO03007049 A1 | 1/2003 |
| WO | WO 03/046508 | 6/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO 2004000717 | 12/2003 |
| WO | WO2004006003 A1 | 1/2004 |
| WO | WO2004026757 A2 | 4/2004 |
| WO | WO 2004/055885 | 7/2004 |
| WO | WO 2004/079056 | 9/2004 |
| WO | WO 2005/019899 A1 | 3/2005 |
| WO | WO 2005/061378 | 7/2005 |
| WO | WO 2005/085932 A | 9/2005 |
| WO | WO 2006/036385 | 4/2006 |
| WO | WO 2006/036437 | 4/2006 |
| WO | WO 2006/036542 | 4/2006 |

OTHER PUBLICATIONS

Office Action for U.S. Appl. No. 11/407,470, filed Jun. 7, 2007.
International Search Report and Written Opinion for PCT Application No. PCT/US2007/009267 dated Oct. 1, 2007, 13 pages.
International Search Report and Written Opinion for PCT Application No. PCT/US2007/007719 dated Oct. 19, 2007, 16 pages.
International Search Report and Written Opinion for PCT Application No. PCT/US2007/007613 dated Oct. 22, 2007, 15 pages.
International Search Report and Written Opinion for PCT Application No. PCT/US2007/008564 dated Oct. 30, 2007, 14 pages.
Aratani et al., "Process and Design Considerations for Surface Micromachined Beams for a Tuneable Interferometer Array in Silicon," Proc. IEEE Microelectromechancial Workshop, Fort Lauderdale, FL, pp. 230-235 (Feb. 1993).
Austrian Search Report for EX72/2005 dated May 13, 2005.
Austrian Search Report for EX81/2005 dated May 18, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. (1996) IOP Publishing.

Furneaux, et al. "The Formation of Controlled-porosity membranes from Anodically Oxidized Aluminum" Nature vo 337 Jan. 12, 1989, pp. 147-149.

Jerman J.H. ET al., "Maniature Fabry-Perot Interferometers Micromachined In Silicon For Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.

Liberman, "MEMS Display Looks to Give PDAs Sharper Image," EE Times (Feb. 11, 1997).

Liberman, "Microbridges at Heart of New MEMS Displays," EE Times (Apr. 24. 1997).

Maboudian, et al. Critical Review: Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1 , pp. 115-117 (May 21-23, 2002).

Penta Vacuum MEMS Etcher Specifications, http://www.pentavacuum.com/memes.htm.

Science and Technology, The Economist, pp. 89-90, (May 1999).

Search Report PCT/US05/030033 and Written Opinion.

Search Report PCT/US05/030902.

Search Report and Written Opinion for PCT/US05/33558/ (May 7,2006).

Search Report PCT/US05/032331 (Apr. 4, 2006).

Search Report PCT/US05/032331 (Jan. 9, 2006).

Search Report and written opinion PCT/US05/032647.

Tayebi et al. "Reducing the Effects of adhesion and fruction in microelectomechanical system (MEMS) through surface roughening: Comparision Between theory and experiments" http://jap.ajp.org/jap/copyright.is Journal of applied Phisics 98, 073528 (2005).

Thin Film Transistors-Materials and Processes -vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Product Information.

Office Action dated Jan. 25, 2009 for U.S. Appl. No. 11/407,730, 35 pages.

Yao et al., BrF3 dry release technology for large freestanding parylene microstructures and electrostatic actuators, Sensors and Actuators A, vol. 97-98, pp. 771-775, Apr. 2002.

Akasaka, "Three-Dimensional IC Trends," Proceedings of IEEE, vol. 74, No. 12, pp. 1703-1714, (Dec. 1986).

Austrian Search Report dated May 4, 2005.

Austrian Search Report dated Aug. 12, 2005.

Aratani et al., "Surface micromachined tuneable interferometer array," Sensors and Actuators, pp. 17-23. (1994).

Conner, "Hybrid Color Display Using Optical Interference Filter Array," SID Digest, pp. 577-580 (1993).

EP 05255661.0 European Search Report (Dec. 30, 2005).

Fan et al., "Channel Drop Filters in Photonic Crystals," Optics Express, vol. 3, No. 1 (1998).

Giles et al., "A silicon MEMS Optical Switch Attenuator and Its Use in Lightwave Subsystems," IEEE Journal of Selected Topics in Quanum-Electronics, vol. 5, No. 1, pp. 18-25, (Jan./Feb. 1999).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).

Goossen K.W., "MEMS-Based Variable Optical Interference Devices", Optical Mems, 2000 IEEE/Leos International Conference on Aug. 21-24, 2000, Piscataway, NJ, USA, IEE, Aug. 21, 2000, pp. 17-18.

Gosch, "West Germany Grabs the Lead in X-Ray Lithography,"Electronics pp. 78-80 (Feb. 5, 1987).

Harnett et al., "Heat-depolymerizable polycarbonates as electron beam patternable sacrificial layers for nanofluidics," J. Vac. Sci, Technol. B 19(6), (Nov./Dec. 2001), pp. 2842-2845.

Howard et al., "Nanometer-Scale Fabrication Techniques," VLSI Electronics: Microstructure Science, vol. 5, pp. 145-153 and pp. 166-173 (1982).

Ibbotson et al., "Comparison of XeF2 and F-atom reactions with Si and SiO2," Applied Physics Letters, vol. 44, No. 12, pp. 1129-1131 (Jun. 1984).

Jackson "Classical Electrodynamics," John Wiley & Sons Inc., pp. 568-573.

Jerman et al., "A Miniature Fabry-Perot Interferometer with a Corrugated Silicon Diaphragm Support," (1988).

Joannopoulos et al., "Photonic Crystals: Molding the Flow of Light,"Princeton University Press (1995).

Johnson, "Optical Scanners," Microwave Scanning Antennas, vol. 2, p. 251-261, (1964)

Kim et al., "Control of Optical Transmission Through Metals Perforated With Subwavelength Hole Arrays," Optic Letters, vol. 24, No. 4, pp. 256-257, (Feb 1999).

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method For Fabricating Released Mems in Single Crystal Silicon", Journal of Microelectromechanical Systems, vol. 8, Issue 4, pp. 409-416. (Dec. 1999).

Light over Matter, Circle No. 36 (Jun. 1993).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 0-8194-2060-Mar. (1996).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfigurable Computing For General-Purpose," IEEE, 0-8186-8900-, pp. 68-77, (May 1998).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, pp. 131-141, (1966).

PCT/US02/13442, Search Report Sep. 13, 2002.

PCT/US04/20330 Search Report Nov. 8, 2004.

PCT/US05/029821 International Search Report (Dec. 27, 2005).

PCT/US05/030927 International Search Report (Jan. 25, 2006).

PCT/US05/031693 International Search Report.

PCT/US05/032331 International Search Report (Apr. 7, 2006).

PCT/US05/033558 Partial International Search Report (Feb. 24, 2006).

PCT/US2004/035820 International Search Report and Written Opinion (Apr. 11, 2005).

PCT/US96/17731 Search Report.

Raley et al., "A Fabry-Perot Microinterferometer for Visible Wavelengths," IEEE Solid-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, November 8, 1998, pp. 225-228, XP000992464.

Stone, "Radiation and Optics, An Introduction to the Classical Theory," McGraw-Hill, pp. 340-343, (1963).

Walker, et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors,"Asia Display '95, pp. 929-931, (Oct. 1995).

Zhou et al., "Waveguide Panel Display Using Electromechanical Spatial Modulators" SID Digest, vol. XXIX, (1998).

IPRP FOR PCT/US07/007719 filed Mar. 28, 2007, Docket No. QCO.051VPC.

* cited by examiner

| | Column Output Signals | |
|---|---|---|
| | $+V_{bias}$ | $-V_{bias}$ |
| Row Output Signals  0 | Stable | Stable |
| $+\Delta V$ | Relax | Actuate |
| $-\Delta V$ | Actuate | Relax |

NON-PLANAR SURFACE STRUCTURES AND PROCESS FOR MICROELECTROMECHANICAL SYSTEMS

CROSS-REFERENCE TO RELATED APPLICATIONS

This application is related to U.S. application Ser. No. 11/189,690, filed Jul. 26, 2005 entitled SYSTEM AND METHOD FOR MICRO-ELECTROMECHANICAL OPERATION OF AN INTERFEROMETRIC MODULATOR; NON-PLANAR SURFACE STRUCTURES AND PROCESS FOR MICROELECTROMECHANICAL SYSTEMS; Ser. No. 11/406,866, filed on even date herewith); NON-PLANAR SURFACE STRUCTURES AND PROCESS FOR MICROELECTROMECHANICAL SYSTEMS; Ser, No, 11/406,776, filed on even date herewith); MICROELECTROMECHANICAL DEVICE AND METHOD UTILIZING NANOPARTICLES Ser. No. 11/407,730, filed on even date herewith); and MICROELECTROMECHANICAL DEVICE AND METHOD UTILIZING A POROUS SURFACE Ser. No. 11/407,470, filed on even date herewith).

BACKGROUND OF THE INVENTION

1. Field of the Invention

This invention relates to microelectromechanical systems. More particularly, this invention relates to methods and apparatus for improving the performance of microelectromechanical systems such as interferometric modulators.

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

An embodiment provides a method of making a microelectromechanical system (MEMS) device that includes providing a substrate, forming a sacrificial layer over the substrate, and partially removing a portion of the sacrificial layer so as to form at least one void that extends through less than the entire thickness of the sacrificial layer wherein the at least one void has a depth dimension in a range of about 100 angstroms to about 500 angstroms as measured perpendicular to the substrate. The method further includes forming an electrically conductive layer over at least a portion of the sacrificial layer and the at least one formed void, thereby forming a non-planar interface between the electrically conductive layer and the sacrificial layer. The method further includes removing the sacrificial layer to form a cavity between the substrate and the electrically conductive layer.

Another embodiment provides a method of making an interferometric modulator that includes providing a substrate, forming a first electrically conductive layer over at least a portion of the substrate, forming a first dielectric layer over the first electrically conductive layer, and partially removing a portion of the first dielectric layer so as to form at least one void that extends through less than the entire thickness of the first dielectric layer. The method further includes forming a sacrificial layer over at least at least a portion of the first dielectric layer and the at least one formed void, forming a second electrically conductive layer over the sacrificial layer, and selectively removing the sacrificial material against the first dielectric layer. Another embodiment provides a released interferometric modulator made by such a method.

Another embodiment provides an interferometric modulator including a substrate, a first electrically conductive layer over at least a portion of the substrate, and a first dielectric layer over the first electrically conductive layer, the first dielectric layer comprising at least one raised portion in the first dielectric layer, the at least one raised portion having a cross sectional dimension in a range of about 2 micrometers to about 5 micrometers as measured parallel to the substrate and a height dimension of about 100 angstroms to about 500 angstroms as measured perpendicular to the substrate. The interferometric modulator further includes a second electrically conductive layer separated from the first dielectric layer by a cavity and a support structure arranged over at least a portion of the substrate and configured to support the second electrically conductive layer.

Another embodiment provides a method of making a microelectromechanical system (MEMS) device that includes providing a substrate, forming a sacrificial layer over the substrate, patterning the sacrificial layer; partially removing a portion of the patterned sacrificial layer by etching so as to form at least one void that extends through less than the entire thickness of the sacrificial layer, forming an electrically conductive layer over at least a portion of the sacrificial layer and the at least one formed void, thereby forming a non-planar interface between the electrically conductive layer and the sacrificial layer, and removing the sacrificial layer to form a cavity between the substrate and the electrically conductive layer.

These and other embodiments are described in greater detail below.

The Figures are not drawn to scale.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

An embodiment provides methods of making interferometric modulators with decreased contact area between a movable surface and another surface so as to reduce adhesion forces between the two surfaces. In some embodiments, the methods involve partial etching to remove a portion of a sacrificial layer and/or another layer.

Figure 1:
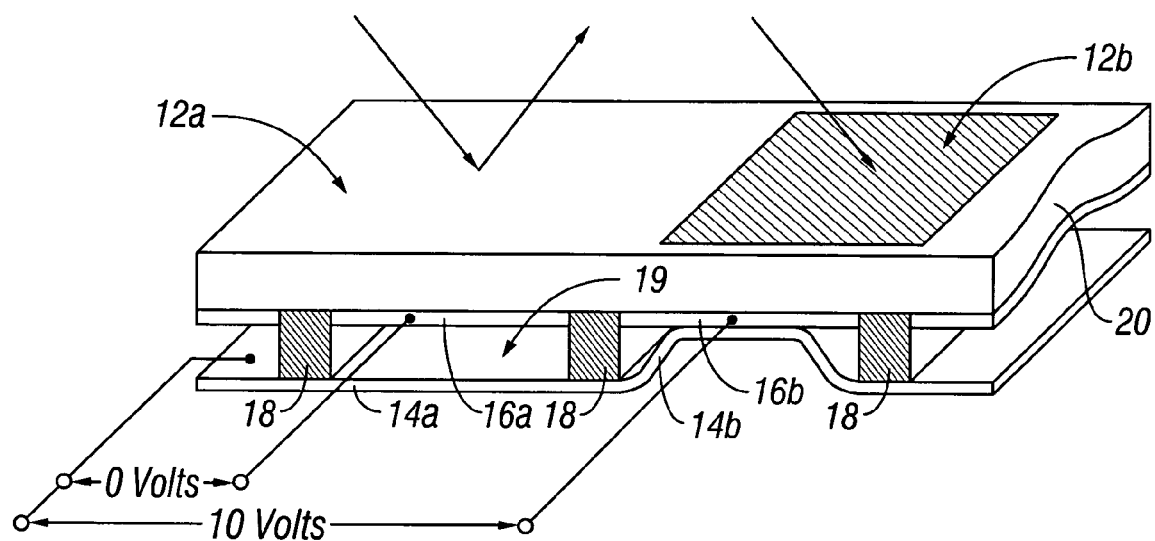
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
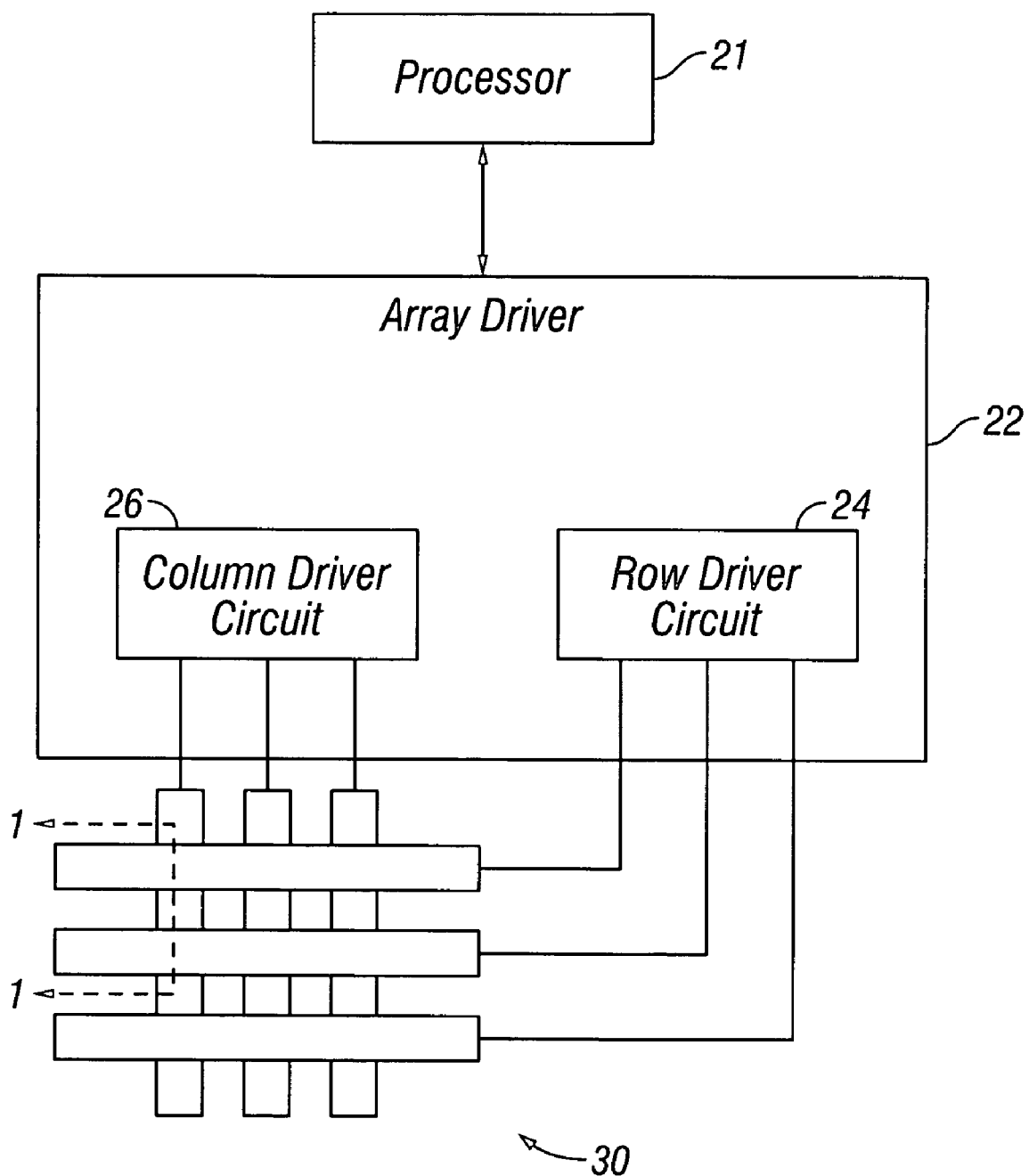
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
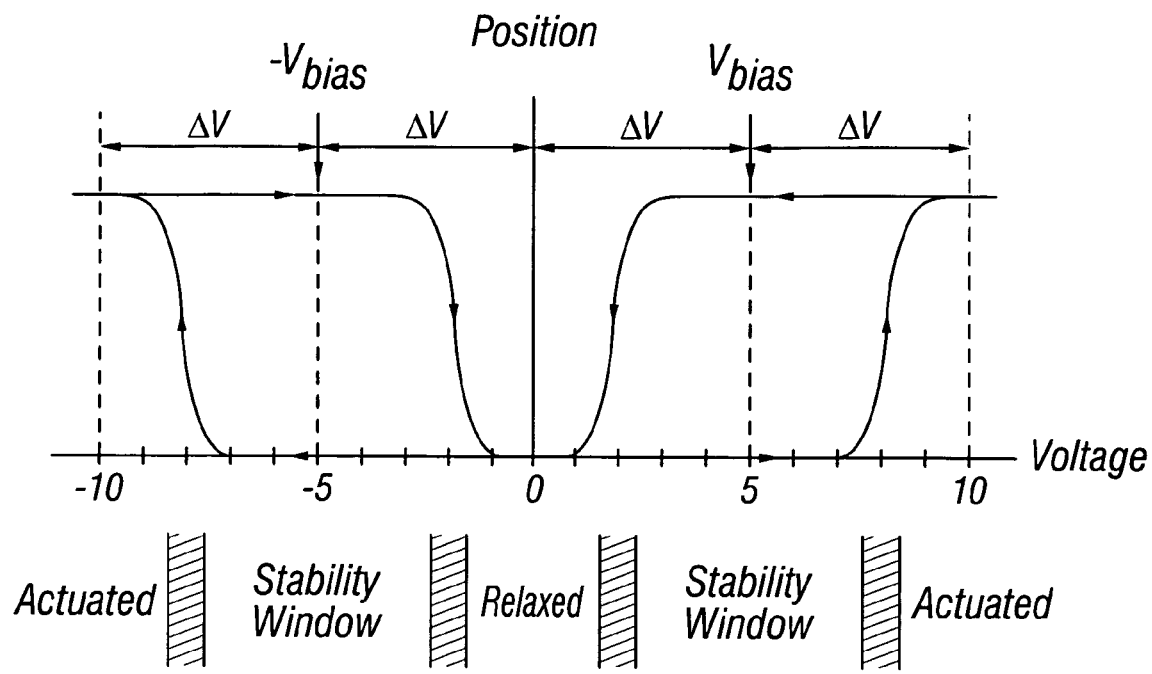
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
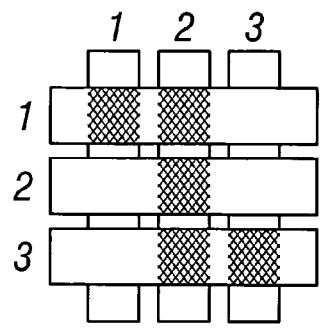
FIG. 5A illustrates one exemplary frame of display data in the 3×3 interferometric modulator display of FIG. 2.
Figure 5B:
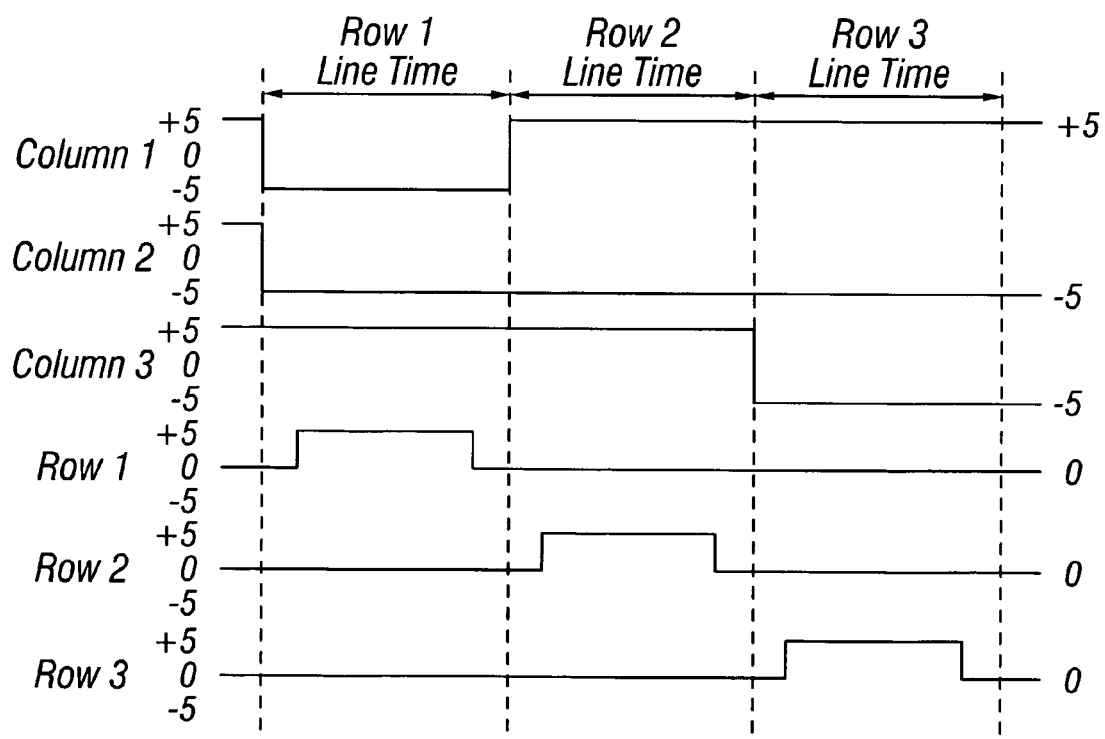
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
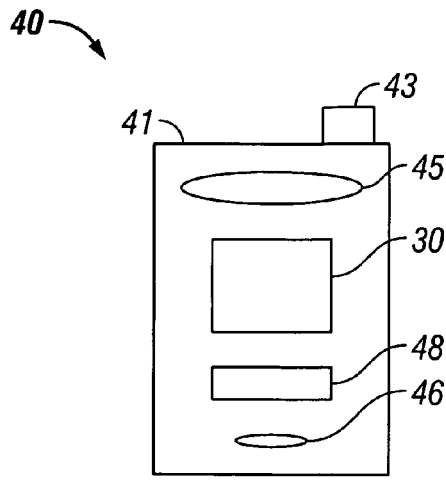
FIGS. 6A and 6B are system block diagrams illustrating an embodiment of a visual display device comprising a plurality of interferometric modulators.
Figure 6B:
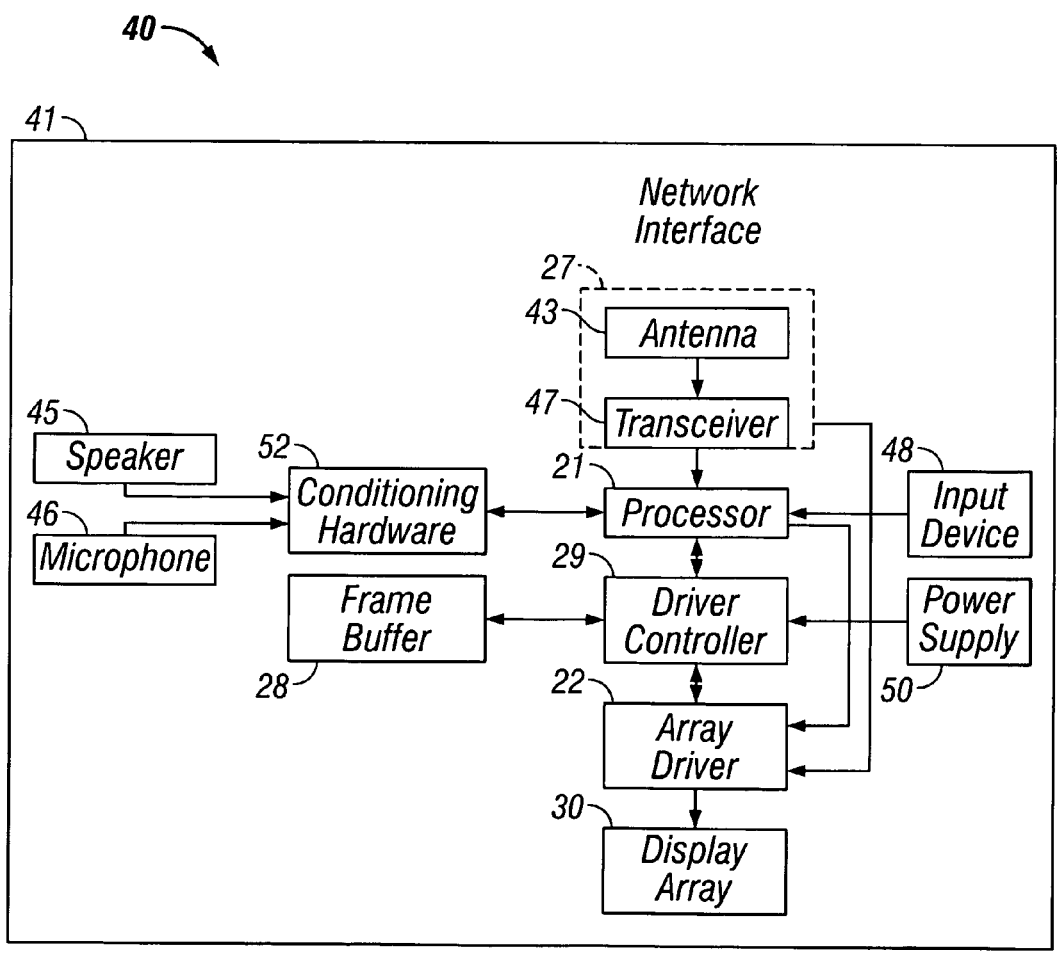

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device such as a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
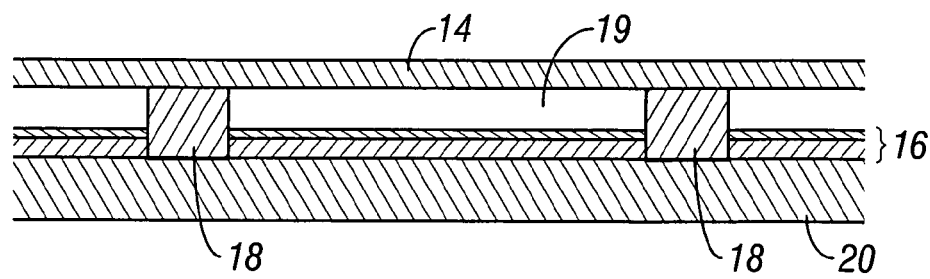
FIG. 7A is a cross section of the device of FIG. 1.
Figure 7B:
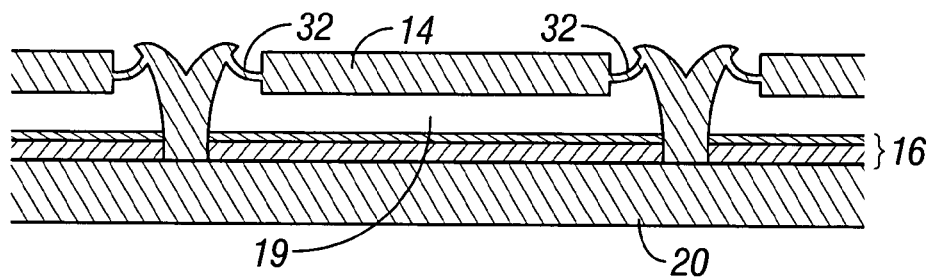
FIG. 7B is a cross section of an alternative embodiment of an interferometric modulator.
Figure 7C:
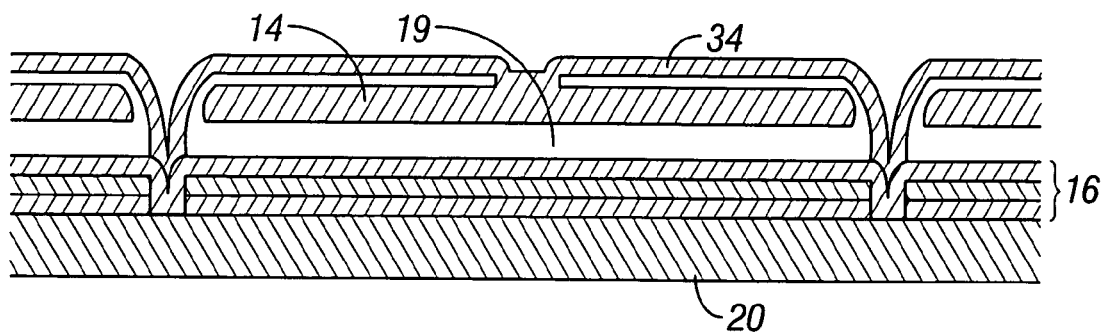
FIG. 7C is a cross section of another alternative embodiment of an interferometric modulator.
Figure 7D:
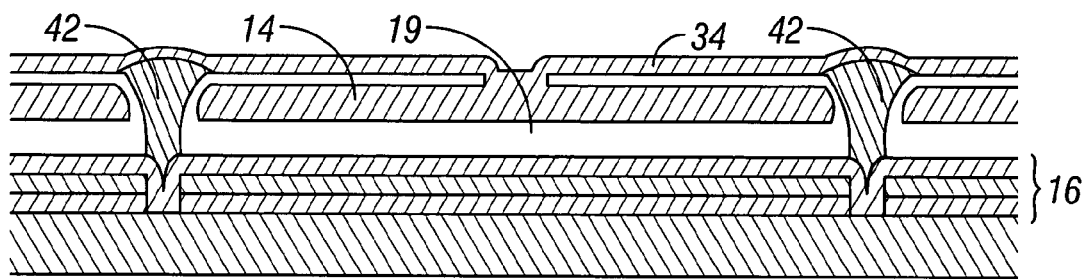
FIG. 7D is a cross section of yet another alternative embodiment of an interferometric modulator.
Figure 7E:
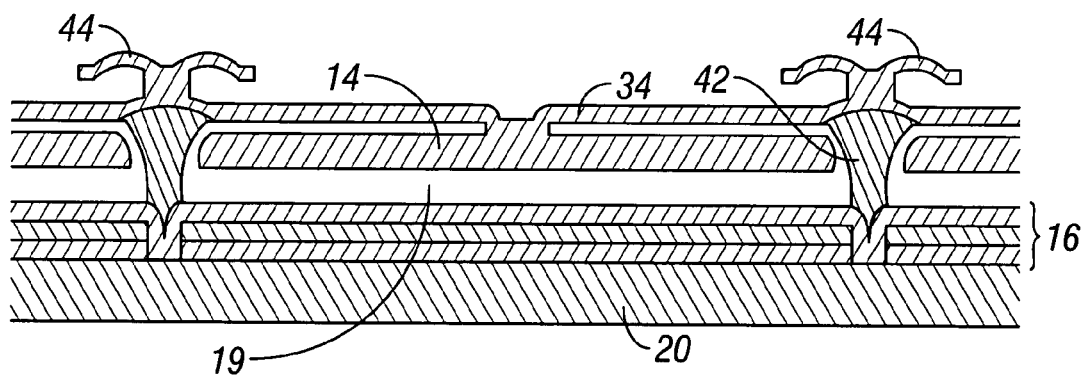
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
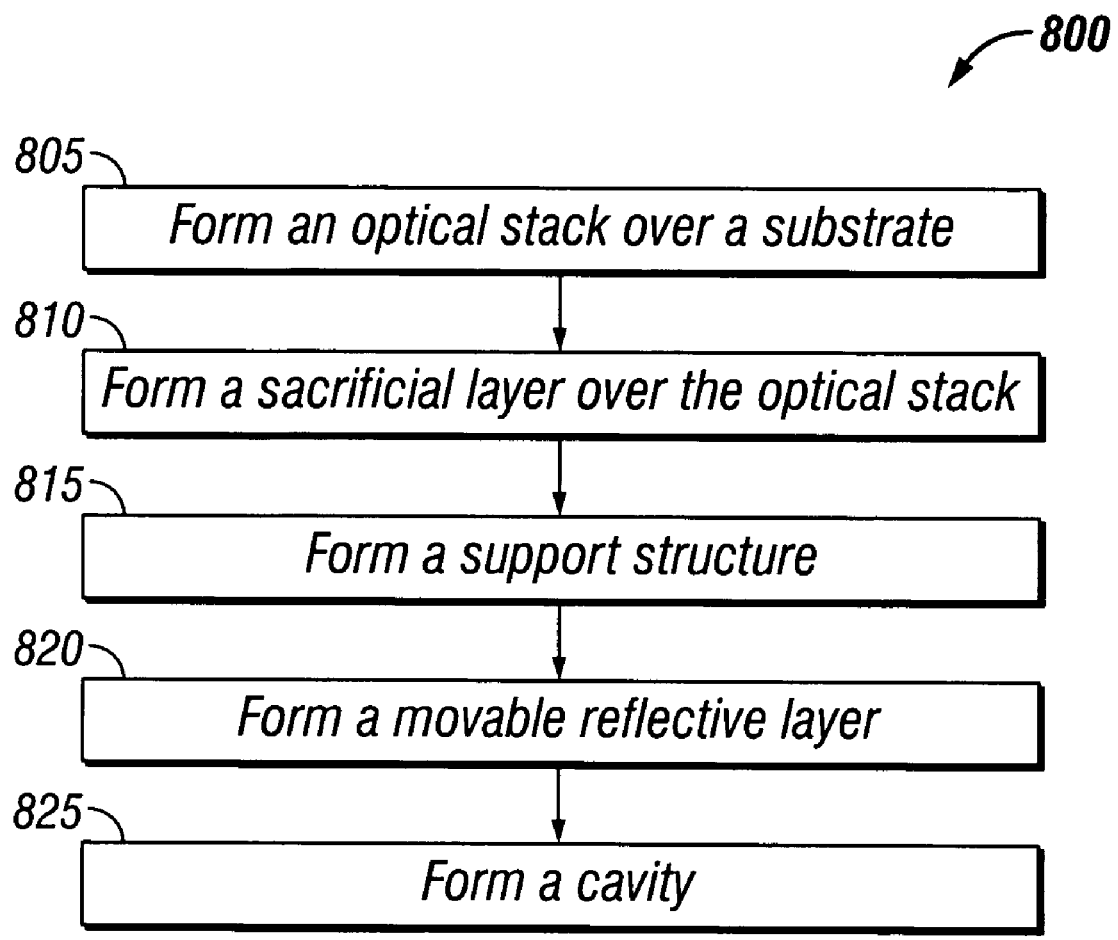
FIG. 8 is a flow diagram illustrating certain steps in an embodiment of a method of making an interferometric modulator.

FIG. 8 illustrates certain steps in an embodiment of a manufacturing process 800 for an interferometric modulator. Such steps may be present in a process for manufacturing, e.g., interferometric modulators of the general type illustrated in FIGS. 1 and 7, along with other steps not shown in FIG. 8. With reference to FIGS. 1, 7 and 8, the process 800 begins at step 805 with the formation of the optical stack 16 over the substrate 20. The substrate 20 may be a transparent substrate such as glass or plastic and may have been subjected to prior preparation step(s), e.g., cleaning, to facilitate efficient formation of the optical stack 16. As discussed above, the optical stack 16 is electrically conductive, partially transparent and partially reflective, and may be fabricated, for example, by depositing one or more of the layers onto the transparent substrate 20. In some embodiments, the layers are patterned into parallel strips, and may form row electrodes in a display device. In some embodiments, the optical stack 16 includes an insulating or dielectric layer that is deposited over one or more metal layers (e.g., reflective and/or conductive layers).

The process 800 illustrated in FIG. 8 continues at step 810 with the formation of a sacrificial layer over the optical stack 16. The sacrificial layer is later removed (e.g., at step 825) to form the cavity 19 as discussed below and thus the sacrificial layer is not shown in the resulting interferometric modulator 12 illustrated in FIG. 1. The formation of the sacrificial layer over the optical stack 16 may include deposition of a $XeF_2$-etchable material such as molybdenum or amorphous silicon, in a thickness selected to provide, after subsequent removal, a cavity 19 having the desired size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

The process 800 illustrated in FIG. 8 continues at step 815 with the formation of a support structure e.g., a post 18 as illustrated in FIGS. 1 and 7. The formation of the post 18 may include the steps of patterning the sacrificial layer to form a support structure aperture, then depositing a material (e.g., a polymer) into the aperture to form the post 18, using a deposition method such as PECVD, thermal CVD, or spin-coating. In some embodiments, the support structure aperture formed in the sacrificial layer extends through both the sacrificial layer and the optical stack 16 to the underlying substrate 20, so that the lower end of the post 18 contacts the substrate 20 as illustrated in FIG. 7A. In other embodiments, the aperture formed in the sacrificial layer extends through the sacrificial layer, but not through the optical stack 16. For example, FIG. 7D illustrates the lower end of the support post plugs 42 in contact with the optical stack 16.

The process 800 illustrated in FIG. 8 continues at step 820 with the formation of a movable reflective layer such as the movable reflective layer 14 illustrated in FIGS. 1 and 7. The movable reflective layer 14 may be formed by employing one or more deposition steps, e.g., reflective layer (e.g., aluminum, aluminum alloy) deposition, along with one or more patterning, masking, and/or etching steps. As discussed above, the movable reflective layer 14 is typically electrically conductive, and may be referred to herein as an electrically conductive layer. Since the sacrificial layer is still present in the partially fabricated interferometric modulator formed at step 820 of the process 800, the movable reflective layer 14 is typically not movable at this stage. A partially fabricated interferometric modulator that contains a sacrificial layer may be referred to herein as an "unreleased" interferometric modulator.

The process 800 illustrated in FIG. 8 continues at step 825 with the formation of a cavity, e.g., a cavity 19 as illustrated in FIGS. 1 and 7. The cavity 19 may be formed by exposing the sacrificial material (deposited at step 810) to an etchant. For example, an etchable sacrificial material such as molybdenum or amorphous silicon may be removed by dry chemical etching, e.g., by exposing the sacrificial layer to a gaseous or vaporous etchant, such as vapors derived from solid xenon difluoride ($XeF_2$) for a period of time that is effective to remove the desired amount of material, typically selectively relative to the structures surrounding the cavity 19. Other etching methods, e.g. wet etching and/or plasma etching, may also be used. Since the sacrificial layer is removed during step 825 of the process 800, the movable reflective layer 14 is typically movable after this stage. After removal of the sacrificial material, the resulting fully or partially fabricated interferometric modulator may be referred to herein as a "released" interferometric modulator.

The performance of MEMS devices in general and interferometric modulators in particular, may be adversely affected by a condition known in the art as stiction. With reference to FIG. 1, stiction can cause, for example, the actuated movable layer 14b to remain in contact with the optical stack 16b, even in the presence of a restoring force that would be expected to return the movable layer 14b to the non-actuated position. Stiction occurs when the total of several adhesion forces, arising from a various adhesion mechanisms, are greater than the restoring force. The restoring force includes the combined mechanical tension forces in the actuated movable layer and the electrostatic forces caused by the applied voltage. Since surface forces become more significant with decreasing device dimensions, and restoring forces shrink with decreasing device dimensions, stiction is a concern for MEMS devices including interferometric modulators.

Adhesion forces may arise from several mechanisms including, for example, capillary forces, van der Waals interactions, chemical bonds and trapped charges. Adhesion forces due to all of these mechanisms, in varying degrees, depend on the contact area and surface separation between the various movable and stationary layers when in the actuated state. Embodiments provide methods of manufacturing MEMS devices with lower contact area and/or larger surface separation, thereby resulting in lower adhesion forces and more favorable performance due to less stiction.

Figure 9:
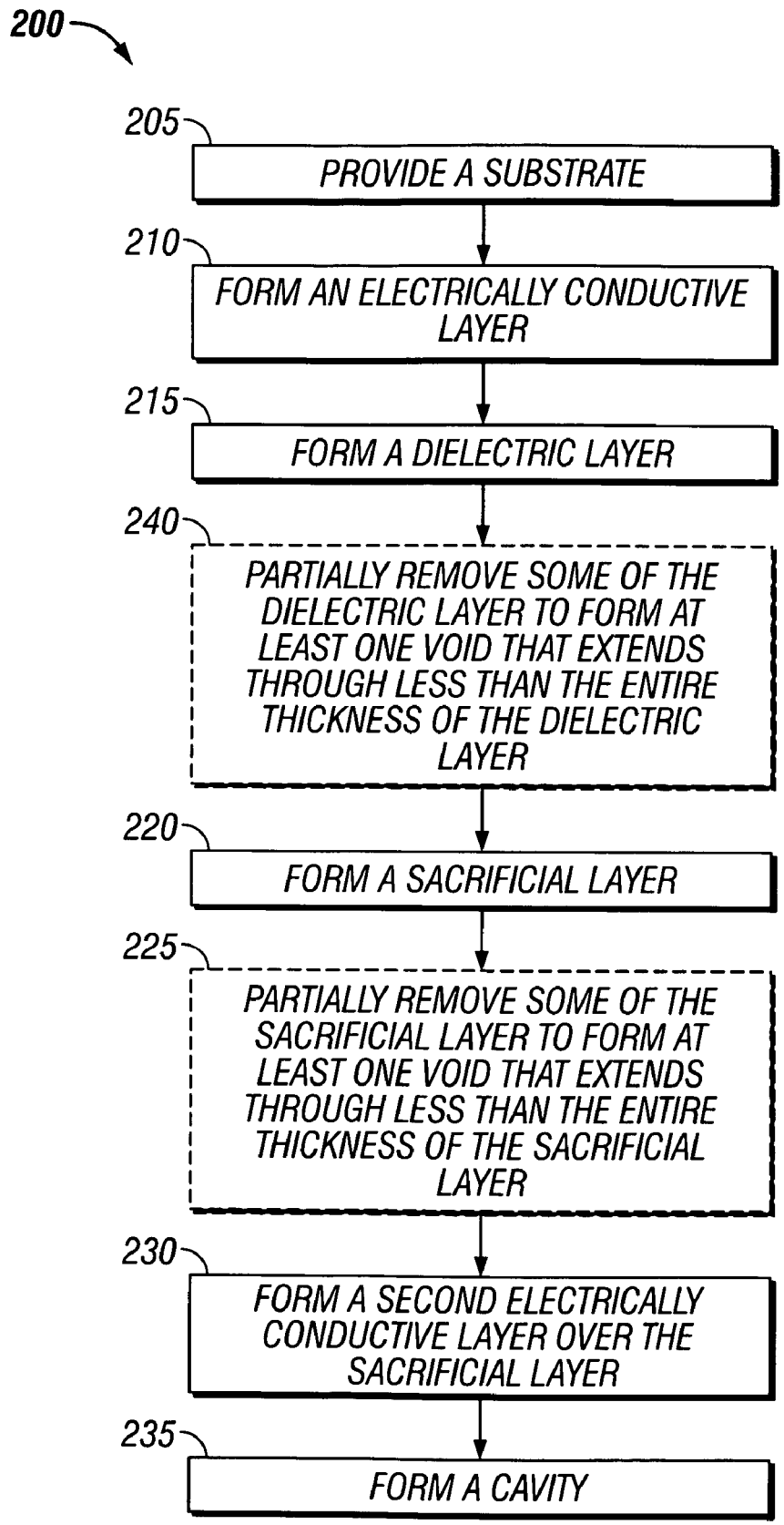
FIG. 9 is a flow diagram illustrating an embodiment of a method of making a MEMS device.

FIG. 9 is a flow diagram illustrating certain steps in an embodiment of a method of making a MEMS device. Such steps may be present in a process for manufacturing, e.g., interferometric modulators of the general type illustrated in FIGS. 1 and 7, along with other steps not shown in FIG. 9. FIGS. 10A through 10G schematically illustrate an embodiment of a method for fabricating a MEMS device using conventional semiconductor manufacturing techniques such as photolithography, deposition, masking, etching (e.g., dry methods such as plasma etch and wet methods), etc. Deposition includes "dry" methods such as chemical vapor deposition (CVD, including plasma-enhanced CVD and thermal CVD) and sputter coating, and wet methods such as spin coating. With reference to FIGS. 9 and 10, the process 200 begins at step 205 where a substrate 100 is provided. In one embodiment, the substrate 100 may comprise any transparent material such as glass or plastic.

Figure 10A:
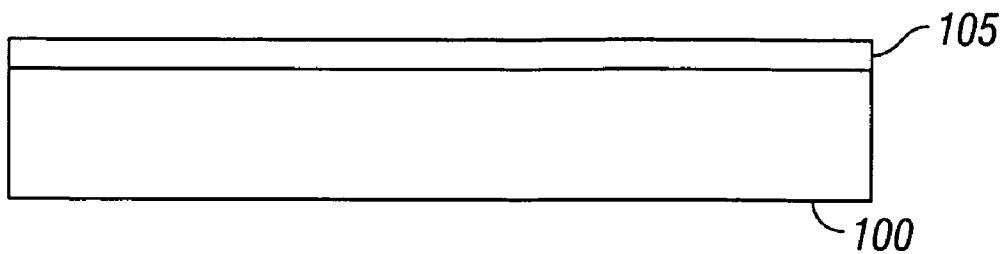
FIGS. 10A through 10G schematically illustrate an embodiment of a method for fabricating a MEMS device.

The process 200 continues at step 210 with the formation of a first electrically conductive layer 105 on the substrate 100 as shown in FIG. 10A. The first electrically conductive layer 105 can be a single layer structure or multiple sub-layer structure as described above. In a single layer structure where the layer 105 functions as both electrode and mirror, the layer 105 is formed by deposition of an electrically conductive material on the substrate 100. The first electrically conductive layer 105 may be formed into electrodes through subsequent patterning and etching not shown in FIGS. 9 or 10. The first electrically conductive layer 105 may be a metal or a semiconductor (such as silicon) doped to have the desired conductivity. In one embodiment (not shown in FIG. 10), the first electrically conductive layer 105 is a multilayer structure comprising a transparent conductor (such as indium tin oxide) and a primary mirror or partially reflective layer (such as chromium).

Figure 10B:
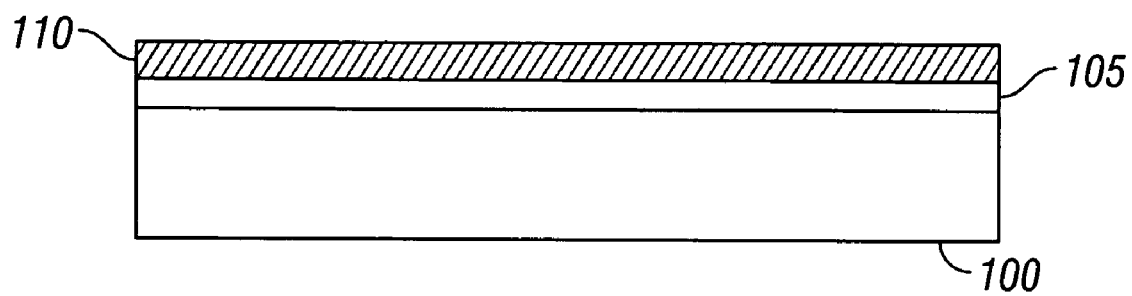

The process 200 continues at step 215 with the formation of a dielectric layer 110 over at least a portion of the electrically conductive layer 105 as shown in FIG. 10B. The dielectric layer 110 may comprise insulating materials such as silicon oxide and/or aluminum oxide. The dielectric layer 110 serves to insulate the first electrically conductive layer 105 from an electrically conductive movable layer (such as movable layer 14 of FIGS. 1 and 7) in an interferometric modulator. The dielectric layer 110 may be formed by known deposition methods, preferably CVD.

Figure 10C:
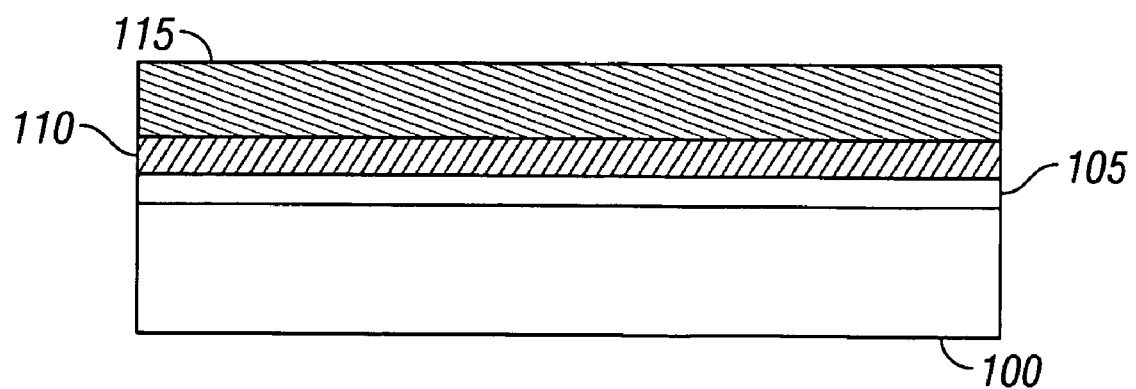
Figure 10D:
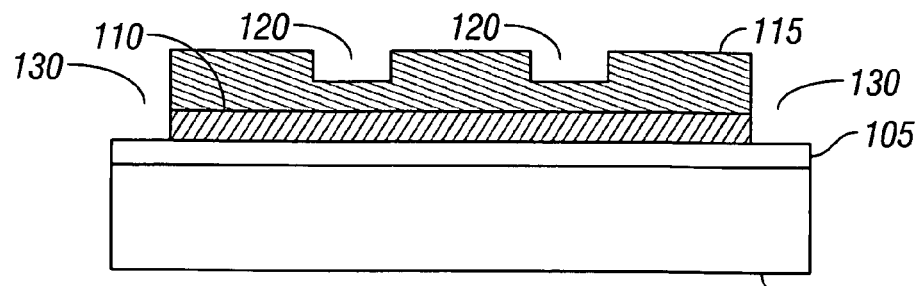
Figure 10E:
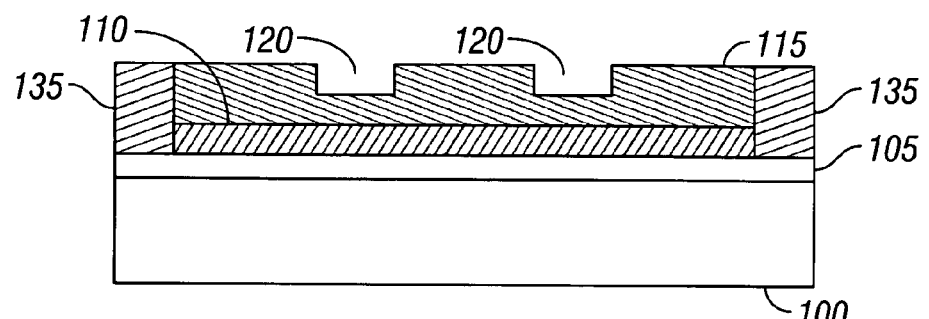

The process 200 continues at step 220 with the formation of a sacrificial layer 115 as shown in FIG. 10C. The sacrificial layer 115 may comprise a material etchable by $XeF_2$, preferably molybdenum. Deposition methods such as CVD, sputtering or spin coating may be used in forming the sacrificial layer 115. In another embodiment, discussed below, an optional step 240 of the process 200 is performed prior to forming the sacrificial layer at step 220. In the current embodiment, the sacrificial layer 115 is patterned and etched at step 225 to form one or more voids 120 and one or more support structure apertures 130, as shown in FIG. 10D. In the embodiment shown the support structure apertures 130 extend entirely through the first sacrificial layer 115 and the dielectric layer 110 to the first electrically conductive layer 105. Support structure material is deposited (step not shown in FIG. 9) into the apertures 130 forming support structures 135 as shown in FIG. 10E. The support structures 135 may comprise a non-conductive material.

The voids 120 are formed by partially removing a portion of the sacrificial layer 115 so as to form a void that extends through less than the entire thickness of the sacrificial layer 115. The voids 120 may be formed by patterning portions of the sacrificial layer 115 (e.g., patterning with a positive or negative photoresist), and partially removing a portion of the sacrificial layer 115 by exposing the sacrificial layer 115 to an etchant for a period of time effective to form the void (e.g., a timed etch). Patterning may include electron beam lithography and/or image transfer. In a preferred embodiment, the duration of the etching and/or the quantity of material removed (e.g., by etching) is preferably limited such that the voids 120 do not adversely affect the optical qualities of a movable reflective layer that is deposited over the sacrificial layer 115. Depending on the material being removed and the etching conditions, the duration of the etching and/or the quantity of material removed to achieve the desired void dimensions may vary, as determined by routine experimentation.

Figure 10F:
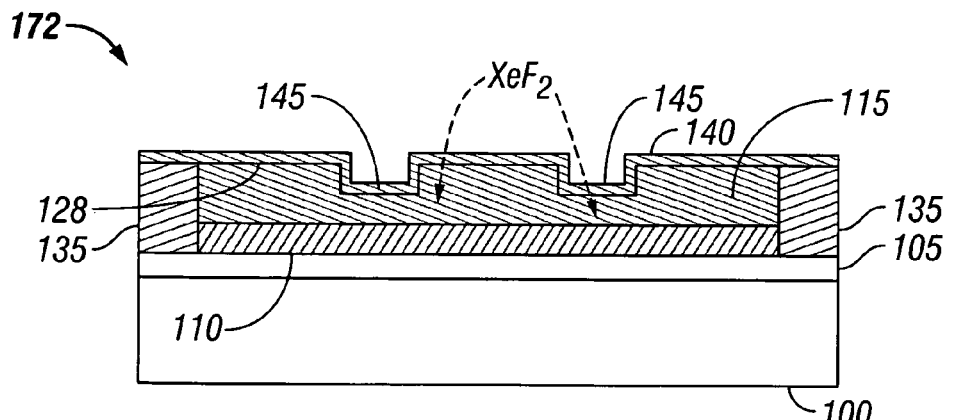

The process 200 continues at step 230 with the formation of a second electrically conductive layer 140 over the sacrificial layer 115 and, in the illustrated embodiment, over the support structures 135. Due to the presence of the voids 120 in the sacrificial layer 115, a non-planar interface 128, characterized by bumps 145 as shown in FIG. 10F, is formed between the sacrificial layer 115 and the second electrically conductive layer 140. In one embodiment, the second electrically conductive layer comprises a movable layer such as the movable layer 14 of an interferometric modulator as shown in FIGS. 1 and 7. Since the sacrificial layer 115 is still present at this stage of the process 200, the movable layer is typically not yet movable. A partially fabricated MEMS device 172, e.g. a partially fabricated interferometric modulator, that contains a sacrificial layer (the layer 115 in this embodiment) may be referred to herein as an "unreleased" MEMS device. The second electrically conductive layer 140 may comprise a metal (e.g. aluminum or aluminum alloy). Forming the electrically conductive layer 140 in step 230 may include one or more deposition steps as well as one or more patterning or masking steps.

Figure 10G:
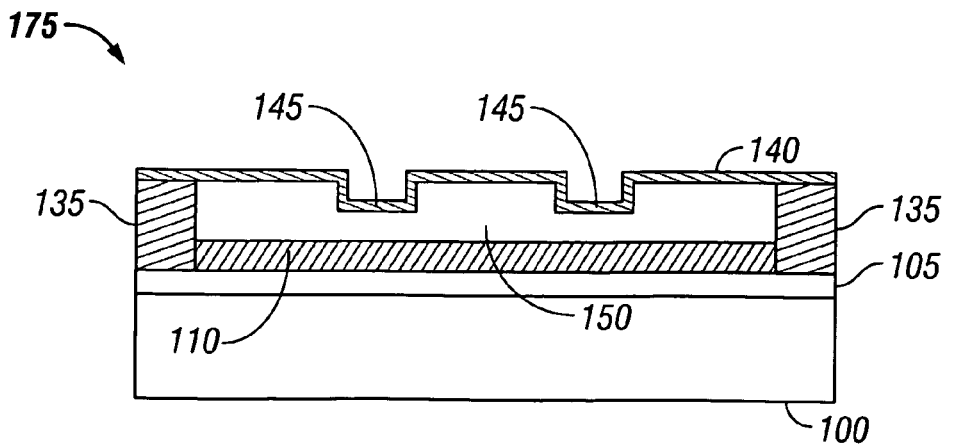

The process 200 continues at step 235 where the sacrificial layer 115 is removed (e.g., by etching) to form a cavity 150 as shown in FIG. 10G. The removal of the sacrificial layers can be accomplished, for example, by exposure to an etchant such as $XeF_2$ (as depicted in FIG. 10F), $F_2$ or HF alone or in combination. In a preferred embodiment, substantially all of the sacrificial layer 115 is removed in the etching process. In one embodiment, the cavity 150 is an interferometric cavity between an optical stack (comprising the electrically conductive layer 105 and the dielectric layer 110) and the conductive movable layer 140. After formation of the cavity 150, the resulting MEMS device, e.g., the interferometric modulator 175, is in a "released" state.

The bumps 145 formed in the second electrically conductive layer 140 serve to reduce the area of contact between the layer 140 and the layer 110 when the interferometric modulator 175 is in the actuated position, thereby reducing or preventing stiction as discussed above. Details of bump configurations, void configurations and dimensions are discussed below. In some embodiments, the process 200 may include additional steps and the steps may be rearranged from the illustrations of FIGS. 9 and 10. For example, the sacrificial layer 115 may be formed over the electrically conductive layer 105, prior to formation of the dielectric layer 110. The dielectric layer 110 may then be formed over the sacrificial layer 115 that contains one or more voids 120. The second electrically conductive layer 140 may then be formed over the dielectric layer 110.

Figure 11A:
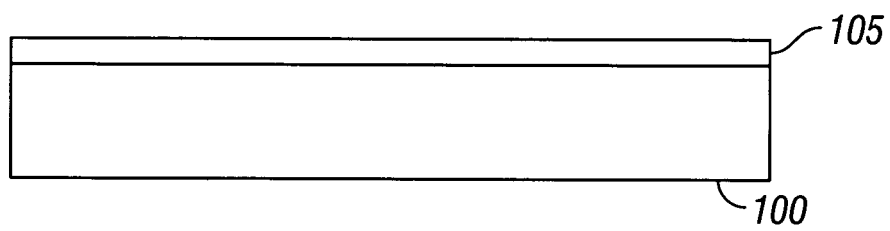
FIGS. 11A through 11G schematically illustrate another embodiment of a method for fabricating a MEMS device.
Figure 11B:
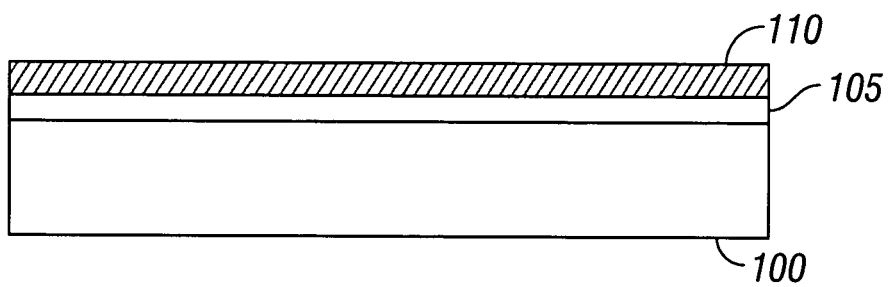
Figure 11C:
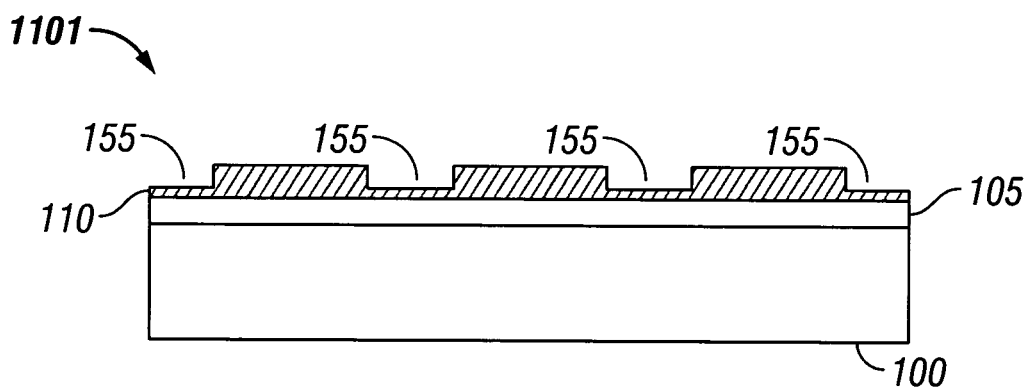
Figure 11D:
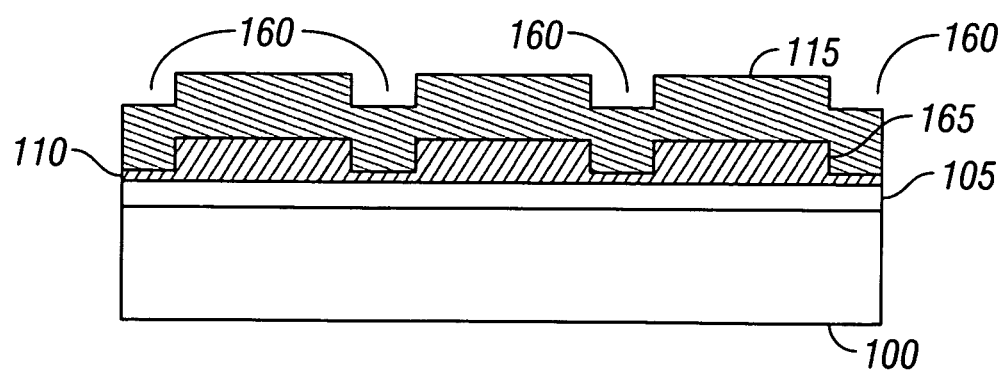

FIGS. 11A through 11G schematically illustrate another embodiment of a method for fabricating a MEMS device such as, e.g., an interferometric modulator. In this embodiment, optional step 240 may be performed instead of or in addition to optional step 225 of FIG. 9. Steps 205, 210 and 215 can be performed in the same way as discussed above and as shown in FIGS. 11A and 11B. In this embodiment, the process 200 continues at step 240, where one or more voids 155, as shown in FIG. 11C, are formed in the dielectric layer 110. Formation of the voids 155 may be accomplished by partially removing a portion of the dielectric layer 110 so as to form a void that extends through less than the entire thickness of the dielectric layer 110. The voids 155 may be formed by patterning portions of the dielectric layer 110 (e.g., patterning with a positive or negative photoresist), and partially removing a portion of the dielectric layer by a timed etch, e.g., by exposing the sacrificial layer to an etchant for a period of time effective to form the void. Patterning may include electron beam lithography and/or image transfer. Details on the preferred dimensions of the dielectric layer 110 and the voids 155 are discussed below. In one embodiment the voids 155 define the distances between raised portions (often referred to as dimples) formed in the remaining dielectric layer 110. The example shown in FIG. 11 forms the voids in the dielectric layer 110, however it should be noted that voids could be formed in any layer (e.g., any layer in an optical stack of an interferometric modulater) including the substrate 100. For example, the voids may be formed in a lower layer, wherein the lower layer comprises at least one of a layer between the dielectric layer 110 and the substrate (e.g., the electrically conductive layer 105), and/or the substrate. In a preferred embodiment, the duration of the etching and/or the quantity of material removed (e.g., by etching) is preferably limited such that the voids 155 do not adversely affect the optical qualities of the optical stack of an interferometric modulator. Depending on the material being removed and the etching conditions, the duration of the etching and/or the quantity of material removed to achieve the desired void dimensions may vary, as determined by routine experimentation.

In one embodiment, a second dielectric layer (not shown in FIG. 11) may be formed over at least a portion of the first dielectric layer 110 containing the voids 155. With a timed etch of a thin layer, such as the dielectric layer 110, a possibility may exist that so much of the dielectric layer 110 could be removed that a short circuit could develop between the first electrically conductive layer 105 and the second electrically conductive layer 140 in an actuated state. The second dielectric layer may reduce the risk of such a short circuit. The second dielectric layer may comprise the same or a different material than the dielectric layer 110.

The process 200 continues at step 220 with the formation of the sacrificial layer 115 over the dielectric layer 110. Since the sacrificial layer 115 is formed over the voids 155 formed in the dielectric layer 110, the upper surface of layer 115 will generally conform to the shape of the voids in the dielectric layer (shown as depressions 160 in FIG. 11D), though generally not exactly. A non-planar interface 165 is formed between the dielectric layer 110 and the sacrificial layer 115.

In one embodiment, the sacrificial layer 115 is comprised of molybdenum. Deposition methods such as CVD, sputtering or spin coating may be used in forming the sacrificial layer 115. In an embodiment, the process 200 continues at optional step 225, conducted as described above.

Figure 11E:
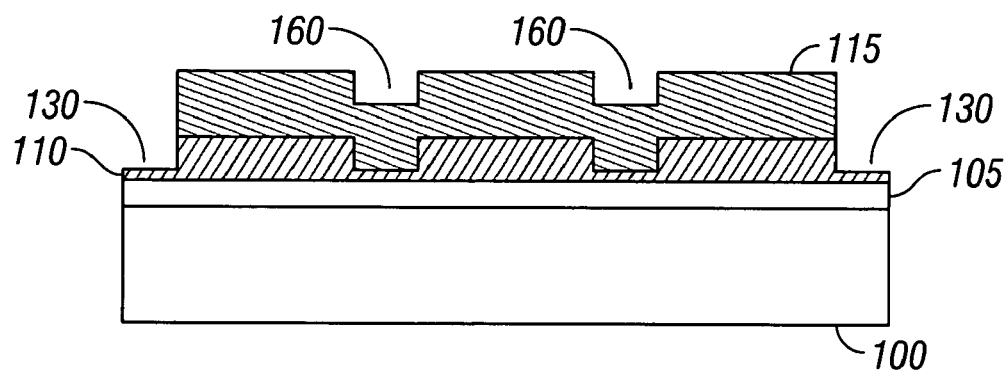
Figure 11F:
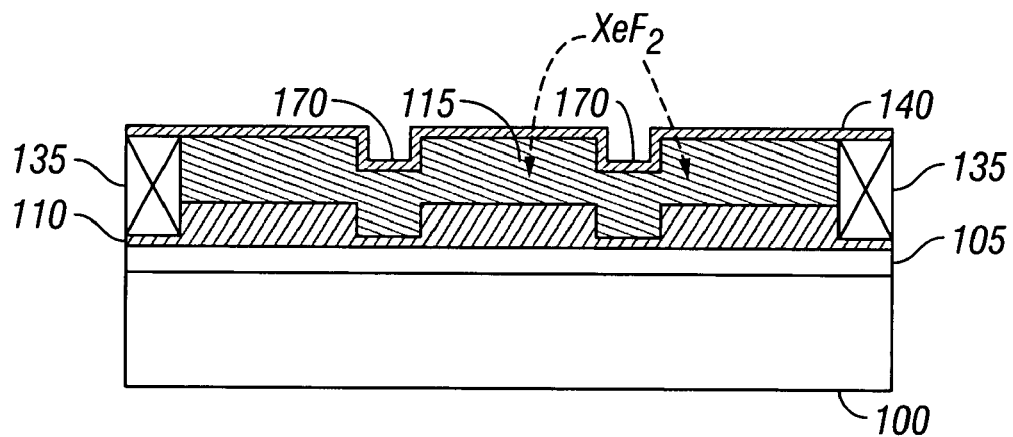

In one embodiment, support structure apertures 130, as shown in FIG. 11E, are formed in the sacrificial layer 115 and support structure material is deposited into the apertures 130 forming support structures 135 as shown in FIG. 11F. The support structures 135 may comprise a non-conductive material.

The process 200 continues at step 230 with the formation of a second electrically conductive layer 140 over the sacrificial layer 115 as shown in FIG. 11F. In this embodiment the second electrically conductive layer comprises one or more bumps 170 formed in the same general shape as the depressions 160 in the sacrificial layer 115. Deposition methods such as CVD, sputtering or spin coating may be used in forming the second electrically conductive layer 140. In one embodiment, the second electrically conductive layer 140 comprises a movable layer such as the movable layer 14 of an interferometric modulator as shown in FIGS. 1 and 7. As discussed above, since the sacrificial layer 115 is still present at this stage of the process 200, the movable layer is typically not yet movable in the unreleased interferometric modulator. The second electrically conductive layer 140 may comprise a metal (e.g. aluminum or aluminum alloy). Forming the electrically conductive layer 140 in step 230 may include one or more deposition steps as well as one or more patterning or masking steps.

Figure 11G:
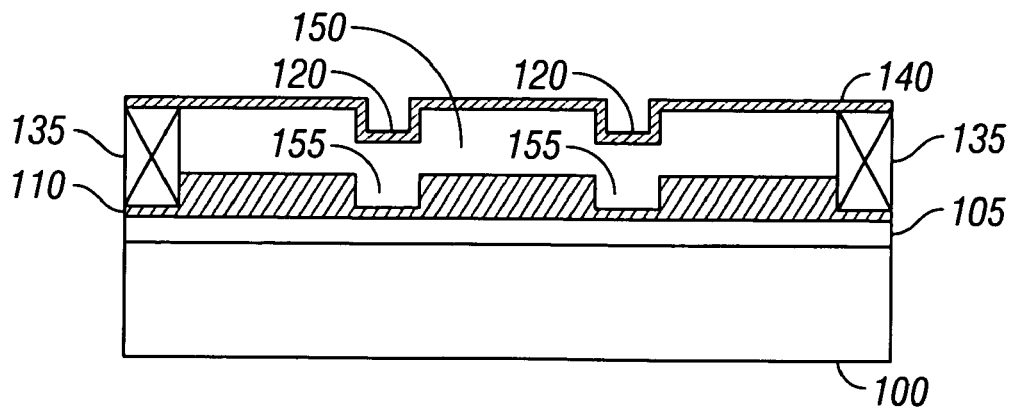

The process 200 continues at step 235 where the sacrificial layer 115 is removed (e.g., by etching) to form a cavity 150 as shown in FIG. 11G. The removal of the sacrificial layer 115 may be accomplished by exposure to an etchant such as $XeF_2$ (as depicted in FIG. 11F), $F_2$ or HF alone or in combination. In a preferred embodiment, substantially all of the sacrificial layer 115 is removed in the etching process. In one embodiment, the cavity 150 is an interferometric cavity between an optical stack (comprising the electrically conductive layer 105 and the dielectric layer 110) and the conductive movable layer 140. After formation of the cavity 150, the interferometric modulator device is in a "released" state. In another embodiment, the sacrificial layer 115 comprises a material that can be selectively removed against a material comprising the dielectric layer 110.

Due to non-exact replication of contour shapes during the deposition steps discussed above, the bumps 170 in the second electrically conductive layer 140 will generally not fit exactly into the voids 155 formed in the dielectric layer 110. Thus, stiction may be reduced during actuation because the contact area is reduced.

Figure 12A:
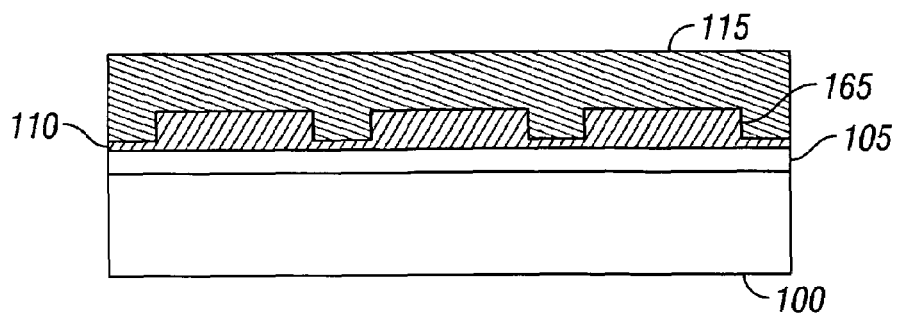
FIGS. 12A through 12D schematically illustrate another embodiment of a method for fabricating a MEMS device.
Figure 12B:
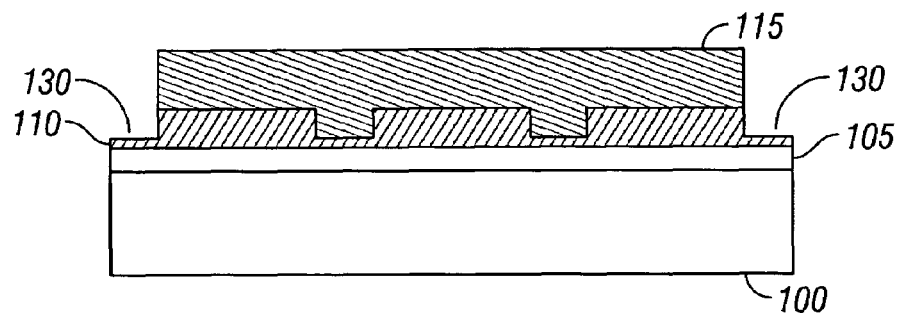
Figure 12C:
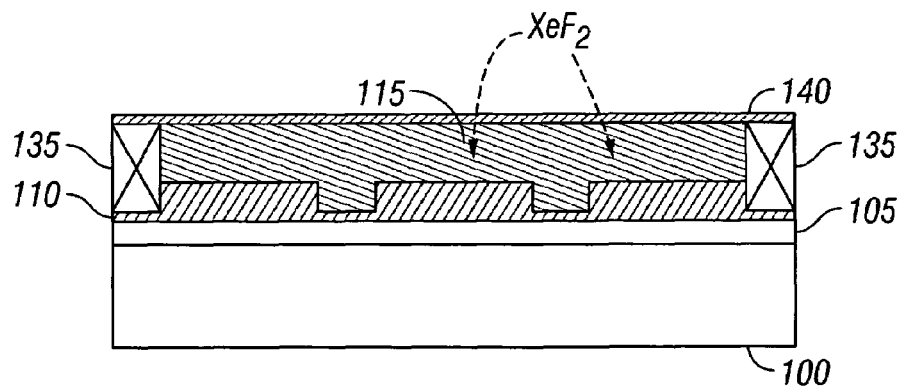
Figure 12D:
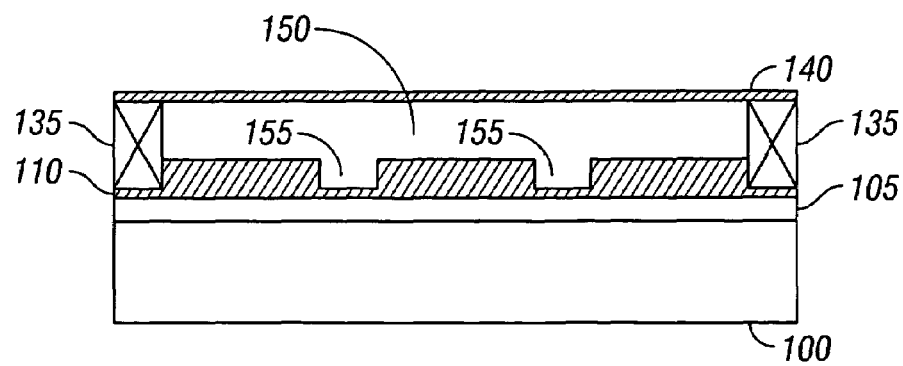

FIGS. 12A through 12D schematically illustrate another embodiment of a method for fabricating a MEMS device. The method illustrated in FIG. 12 may be performed starting with the partially fabricated MEMS device 1101, after the formation of the voids 155 in the dielectric layer 110, as shown in FIG. 11C. In this embodiment, the sacrificial layer 115 is planarized during formation in step 220, thereby removing or preventing the formation of the depressions 160 shown in FIG. 11D. In the embodiment shown in FIG. 12A, the planarization is performed before the formation of the support structure apertures 130 (shown in FIG. 12B) and before the second electrically conductive layer 140 is deposited in step 230 of FIG. 9, as shown in FIG. 12C. The result is a substantially planar second electrically conductive layer 140 as illustrated in FIG. 12D. Since the dielectric layer 110 is non-planar due to the voids 155, the contact surface area during actuation is reduced, thereby reducing the adhesion forces and reducing the likelihood of stiction. Planarizing may be accomplished by chemical mechanical polishing (CMP) and/or by forming the sacrificial layer 115 by spin coating. When using CMP for planarizing the sacrificial layer 115, precautions should be taken to provide a sufficient depth of sacrificial material in the sacrificial layer 115 to provide a desired thickness of the sacrificial layer 115 after removal of some of the sacrificial material during CMP. The remaining sacrificial layer 115 will define the depth of the cavity 150 (shown in FIG. 12D) that is formed during release of the MEMS device in step 235 of FIG. 9.

Figure 13:
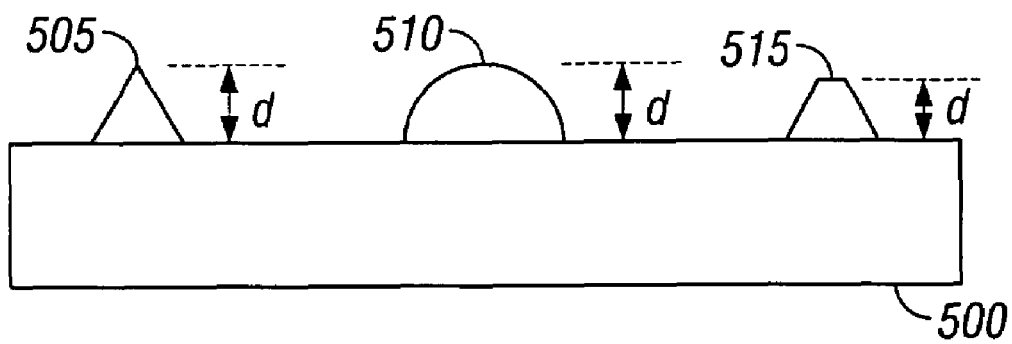
FIG. 13 is a side cross sectional view of alternative embodiments of non-planar surface formations.

The methods discussed above are used to fabricate non-planar surface formations such as bumps, depressions, dimples etc. The embodiments of the surface formations shown in FIGS. 10, 11 and 12 have substantially flat upper surfaces, but this is not necessary and may not be desirable. For example, FIG. 13 shows a side cross sectional view illustrating alternative embodiments of non-planar surface formations that may be used to minimize contact area and/or provide increased separation distance to prevent stiction. The various non-planar surface formations of FIG. 13 include a triangular cross section 505, a semicircular (or elliptical) cross section 510 and a polygon 515. The surface formations 505, 510 and 515 all have a smaller surface area on the top, for a given base dimension, than the rectangular cross sections shown in FIGS. 10 and 11 (the top portion being the portion that will contact another surface moving toward the substrate 500). Therefore, these alternative formations may be more desirable for reducing stiction than the generally rectangular bumps shown in FIGS. 10 and 11. In one embodiment, isotropic etching may be used to form cross sections such as those shown in FIG. 13.

The surface formations 505, 510 and 515 exemplified in FIG. 13 are characterized by a height dimension labeled "d" in FIG. 13. The height "d" is measured perpendicular to the substrate 500 as shown in FIG. 13. In the case of surface formations formed by forming a layer over another layer containing apertures, or depressions caused by lower formed apertures, the height of the non-planar surface formation will be determined by the depth of the aperture or depression as discussed above. Various surface formations (such as the formations 505, 510, and 515) may be referred to herein as dimples, and may be characterized by a height "d" as shown in FIG. 13. The shapes of the dimples 505, 510 and 515 are only examples and other shapes may be used.

Figure 14:
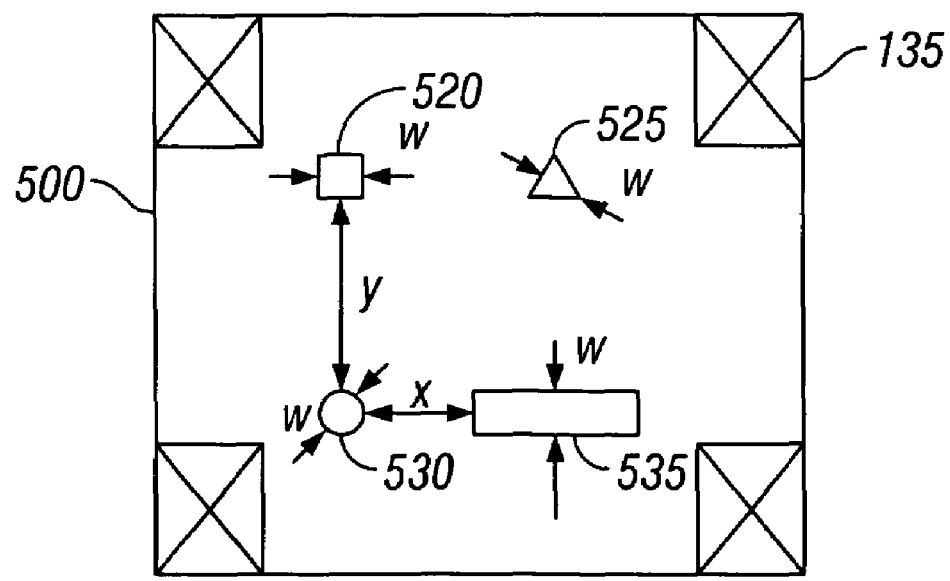
FIG. 14 is a top cross sectional view of alternative embodiments of non-planar surface formations.

FIG. 14 shows a top cross sectional view of alternative embodiments of non-planar surface formations, e.g. dimples, on a MEMS device, e.g. an interferometric modulator. The interferometric modulator is formed on the substrate 500 and has four support structures 135, positioned in the corners. The interferometric modulator is shown having four dimples, a square dimple 520, a triangular dimple 525, a generally circular dimple 530 and an oblong rectangular dimple 535. Each of the dimples 520, 525, 530, and 535 is characterized by a minimum cross sectional dimension "w" as measured parallel to the substrate 500. The shapes of the dimples 520, 525, 530 and 535 are only examples and other shapes may be used. The distances between the dimples in FIG. 14 are indicated by "y" between dimple 520 and dimple 530, and by "x" between dimple 530 and dimple 535. The distances "x" and "y" will be referred to herein as the separation distance between dimples. Preferred dimple configurations and dimensions (utilizing the dimple height, the dimple cross sectional dimension, and the separation distance as discussed above and shown in FIGS. 13 and 14) will now be discussed in relation to various adhesion force characteristics as well as patterning and etching capabilities.

As discussed above, adhesion forces may arise from several mechanisms including, for example, capillary forces, van der Waals interactions, chemical bonds and trapped charges. Adhesion forces due to all of these mechanisms, in varying degrees, depend on the contact area and surface separation between the various movable and stationary layers when in the actuated state. Adhesion forces can be classified into two types, short range and long range. Short range adhesion is affected by the contact area between two surfaces. For a given bump or dimple contact surface area, short range adhesion is mainly affected by the distance between the bumps or dimples. Thus, short range adhesion is roughly proportional to the contacting surface area ratio, or as it is also known, the fill factor (the fraction of total surface area in contact). Long range adhesion is affected mainly by the height of the bumps as measured perpendicular to the contact surfaces. Long range adhesion acts over separation distances in the range of about 200 angstroms to about 300 angstroms. Capillary forces are one example of long range adhesion forces.

As two hydrophilic surfaces approach each other in a humid environment, the liquid undergoes capillary condensation as soon as the separation distance equals:

$$d = 2r_k \cos\theta \quad (1)$$

where $r_k$ is the Kelvin radius given by:

$$r_k = \frac{\gamma v}{RT \log(P/P_s)} \quad (2)$$

where $\gamma$ is the surface tension of water, $v$ is the molar volume and $P/P_s$ is the relative vapor pressure. For example, $\gamma v/RT=0.54$ nanometers for water at 20° C. In one embodiment of an interferometric modulator, aluminum and/or aluminum oxide surfaces contact at an angle in a range of about 7 to about 10 degrees, while the relative humidity inside the package is in a range of about 0.3% to about 3% (or P/Ps in a range of about 0.1% to about 0.01%), resulting in a separation below which water condensation occurs (using equations (1) and (2) above) for which d is equal to about 1.8 angstroms. Thus, any dimple height significantly larger than this distance will result in capillary force reduction proportional to the area ratio of the dimple surface contact area ratio.

Van der Waals interactions result from the interaction between the instantaneous dipole moments of atoms. These attraction forces are quite strong at the asperity contacts due to the surface roughness. However, these forces may be significant even at non-contacting surface asperities if the surface separation is very small. In one embodiment of interferometric modulators, the surface separation between the actuated movable surface and the stationary surface is in a range of about 100 angstroms to about 200 angstroms. Therefore, dimples larger than this range have the potential for reducing the van der Waals interaction adhesion forces.

Chemical bonds are due to chemical interactions between molecules at the asperity contacts of the contact area or across very small gaps. Relatively large gaps, e.g. on the order of about 100 angstroms will eliminate the adhesion forces due to chemical bonds thus reducing the area producing chemical bond forces to the area of the dimples.

Electrostatic forces due to trapped charges in the various layers of the stationary and movable layers may be present. Since these forces are inversely proportional to the square of the surface separation, reducing the contact area and increasing the separation distance with increased dimple height will both serve to reduce the electrostatic adhesion forces.

All the adhesion forces discussed above reduce with greater separation. The preferred minimum amount of separation is mainly a function of the root mean square (RMS) of surface roughness of the deposited materials. RMS surface roughness in one embodiment may be about 10 to about 20 angstroms. RMS surface roughness may be measured in various ways, preferably by atomic force microscopy. In an embodiment of interferometric modulators discussed above, where the surface separation between the actuated movable surface and the stationary surface is in a range of about 100 angstroms to about 200 angstroms, dimples in excess of this range will reduce the adhesion forces. The preferred maximum dimple height is mainly a function of not affecting the optical (in the case of interferometric modulators) or electrical properties of the interferometric modulator. Optical properties may exhibit optical degradation with dimples of about 500 angstroms in height or taller. Therefore, a dimple height in a range of about 100 angstroms to about 500 angstroms is preferable for the embodiment of the interferometric modulator discussed here.

The dimples should be as small in horizontal dimension as possible, since the contact area will be minimized for a given dimple separation distance. The cross sectional width of dimples created by masking and patterning techniques known in the art are limited by the photolithography limits of the masking technology being used to form the dimples (or the separation of apertures in the case of forming dimples in the lower stationary levels as shown in FIG. 11 above). Typical photolithography limits permit details on the order of a range from about 2 micrometers to about 5 micrometers. Therefore, the typical minimum sized dimples (in terms of a horizontal dimension as measured parallel to the substrate) are in a range of about 2 micrometers to about 5 micrometers. Improvements in photolithography below this range would allow smaller dimples than this.

The lateral separation distance (as measured parallel to the substrate) between dimples will determine the contact area reduction achieved and will therefore determine the reduction in adhesion forces. One would like the dimples to be as far apart as possible, however mechanical properties of the movable elements in MEMS devices or interferometric modulators may limit the lateral distance. Bending of the mechanical/movable layer may cause local collapse and result in contact of a significant surface area. Therefore, it is desirable to design the separation distance, in one embodiment, to prevent local collapse of a mechanical/movable element. Finite element analysis and electrostatic pressure calculations, known to those of skill in the art, may be used to estimate the maximum separation distance to prevent collapse. These calculations depend on the stiffness of the layer (or layers in case of two or more bendable layers) being supported by the dimples. Separation distances of up to about 100 micrometers may be obtained for some mechanical/movable elements of the various interferometric modulators as shown in FIG. 7. The preferred smallest separation distance is typically on the order of about 4 micrometers in order to obtain a reasonable area reduction for the smallest dimples that could be fabricated by photolithography (about 2 micrometers across). Therefore, in a preferred embodiment, the separation distance of the dimples created by the fabrication methods discussed above (or the width of the formed aperture separating the dimples) is in the range of about 4 micrometers to about 100 micrometers.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of making a microelectromechanical system (MEMS) device, comprising:
   providing a substrate;
   forming a sacrificial layer over the substrate;
   partially removing a portion of the sacrificial layer so as to form at least one void that extends through less than the entire thickness of the sacrificial layer, wherein the at least one void has a depth dimension in a range of about 100 angstroms to about 500 angstroms as measured perpendicular to the substrate;
   forming an electrically conductive layer over at least a portion of the sacrificial layer and the at least one formed void, thereby forming a non-planar interface between the electrically conductive layer and the sacrificial layer; and
   removing the sacrificial layer to form a cavity between the substrate and the electrically conductive layer.

2. The method of claim 1, wherein the substrate comprises a second electrically conductive layer.

3. The method of claim 2, wherein the second electrically conductive layer comprises indium tin oxide.

4. The method of claim 1, wherein the electrically conductive layer comprises a movable layer.

5. The method of claim 1, wherein the substrate comprises a partially reflective layer.

6. The method of claim 1, wherein partially removing the portion of the sacrificial layer comprises exposing the sacrificial layer to an etchant for a period of time effective to form the void.

7. The method of claim 1, further comprising patterning the sacrificial layer.

8. The method of claim 7, wherein the patterning comprises at least one of electron beam lithography and image transfer.

9. The method of claim 7, further comprising:
   forming a support structure aperture in the sacrificial layer; and
   depositing a support structure into the support structure aperture, the support structure configured to support the electrically conductive layer.

10. The method of claim 1, wherein partially removing the portion of the sacrificial layer further comprises:
    patterning the sacrificial layer; and
    etching the sacrificial layer.

11. A method of making an interferometric modulator, comprising:
    providing a substrate;
    forming a first electrically conductive layer over at least a portion of the substrate;
    forming a first dielectric layer over at least a portion of the first electrically conductive layer;
    partially removing a portion of a lower layer, wherein the lower layer comprises one of the first dielectric layer, and a layer between the first dielectric layer and the substrate so as to form at least one void that extends through less than the entire thickness of the lower layer in which the void is formed;
    forming a sacrificial layer over at least a portion of the first dielectric layer and the at least one formed void;
    forming a second electrically conductive layer over the sacrificial layer; and selectively removing the sacrificial material against the first dielectric layer.

12. The method of claim 11, further comprising:
    forming a second dielectric layer over at least a portion of the first dielectric layer containing the at least one void; and
    forming the sacrificial material over the second dielectric layer.

13. The method of claim 11, further comprising planarizing the sacrificial layer prior to forming the second electrically conductive layer.

14. The method of claim 13, wherein planarizing comprises at least one of chemical mechanical polishing and spin coating.

15. The method of claim 11, wherein the at least one void is configured so as to form a raised portion having a cross sectional dimension in a range of about 2 micrometers to about 5 micrometers as measured parallel to the substrate.

16. The method of claim 11, wherein the at least one void is configured so as to form at least two raised portions in the first dielectric layer, wherein the at least two raised portions are separated by a distance in a range from about 4 micrometers to about 100 micrometers.

17. The method of claim 11, wherein the at least one void has a depth dimension in a range of about 100 angstroms to about 500 angstroms as measured perpendicular to the substrate.

18. The method of claim 11, wherein partially removing the portion of the lower layer comprises exposing the lower layer to an etchant for a period of time effective to form the void.

19. A method of making a microelectromechanical system (MEMS) device, comprising:
    providing a substrate;
    forming a sacrificial layer over the substrate;
    patterning the sacrificial layer;
    partially removing a portion of the patterned sacrificial layer by etching so as to form at least one void that extends through less than the entire thickness of the sacrificial layer;
    forming an electrically conductive layer over at least a portion of the sacrificial layer and the at least one formed void, thereby forming a non-planar interface between the electrically conductive layer and the sacrificial layer; and
    removing the sacrificial layer to form a cavity between the substrate and the electrically conductive layer.

20. The method of claim 19, wherein the at least one void has a depth dimension in a range of about 100 angstroms to about 500 angstroms as measured perpendicular to the substrate.

* * * * *